(12) United States Patent
Kim et al.

(10) Patent No.: US 11,723,200 B2
(45) Date of Patent: *Aug. 8, 2023

(54) SEMICONDUCTOR DEVICE

(71) Applicant: Samsung Electronics Co., Ltd., Suwon-si (KR)

(72) Inventors: Kang Min Kim, Hwaseong-si (KR); Jin Hyuk Kim, Hwaseong-si (KR); Jung Tae Sung, Seoul (KR); Joong Shik Shin, Yongin-si (KR); Sung Hyung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

This patent is subject to a terminal disclaimer.

(21) Appl. No.: 17/399,239

(22) Filed: Aug. 11, 2021

(65) Prior Publication Data
US 2021/0375906 A1 Dec. 2, 2021

Related U.S. Application Data

(63) Continuation of application No. 16/912,894, filed on Jun. 26, 2020, now Pat. No. 11,121,148.

(30) Foreign Application Priority Data

Dec. 27, 2019 (KR) .......................... 10-2019-0176457

(51) Int. Cl.
*H10B 43/20* (2023.01)
*H01L 29/06* (2006.01)
(Continued)

(52) U.S. Cl.
CPC ............. *H10B 43/20* (2023.02); *G11C 7/18* (2013.01); *H01L 29/0649* (2013.01); *H01L 29/0847* (2013.01)

(58) Field of Classification Search
CPC ..... G11C 7/18; H01L 29/0649; H01L 29/792; H10B 41/27; H10B 41/10; H10B 43/20;
(Continued)

(56) References Cited

U.S. PATENT DOCUMENTS 9,245,962 B1 * 1/2016 Yang ................. H01L 29/42344
9,397,114 B2 7/2016 Yun et al.
(Continued)

*Primary Examiner* — Dao H Nguyen
(74) *Attorney, Agent, or Firm* — Muir Patent Law, PLLC

(57) ABSTRACT

A semiconductor device includes a first substrate including a cell region and surrounded by an extension region, a common source plate on the first substrate, a supporter on the common source plate, a first stack structure on the supporter and including an alternately stacked first insulating film and first gate electrode, a channel hole penetrating the first stack structure, the supporter, and the common source plate on the cell region, and an electrode isolation trench spaced apart from the channel hole in a first direction on the cell region, extending in a second direction, and penetrating the first stack structure, the supporter, and the common source plate, wherein a first thickness of the supporter in a first region adjacent to the electrode isolation trench is greater than a second thickness of the supporter in a second region formed between the electrode isolation trench and the channel hole.

20 Claims, 25 Drawing Sheets

(51) Int. Cl.
*H01L 29/08* (2006.01)
*G11C 7/18* (2006.01)

(58) Field of Classification Search
CPC ........ H10B 43/10; H10B 43/27; H10B 43/35; H10B 43/40
USPC ........................................................ 257/324
See application file for complete search history.

(56) References Cited

U.S. PATENT DOCUMENTS

| | | |
|---|---|---|
| 9,716,099 B2 | 7/2017 | Choi |
| 10,128,264 B2 | 11/2018 | Lee |
| 10,199,359 B1 | 2/2019 | Sakakibara et al. |
| 10,411,033 B2 | 9/2019 | Kim et al. |
| 10,770,477 B2 * | 9/2020 | Lee .................... H01L 27/1157 |
| 11,121,148 B2 * | 9/2021 | Kim .................. H01L 27/11556 |
| 2012/0068247 A1 * | 3/2012 | Lee .................. H01L 27/11556 |
| | | 257/E27.06 |
| 2012/0086072 A1 | 4/2012 | Yun et al. |
| 2015/0001460 A1 * | 1/2015 | Kim .................... H01L 27/0688 |
| | | 257/5 |
| 2016/0079272 A1 * | 3/2016 | Lee ....................... H01L 21/223 |
| | | 438/269 |
| 2019/0096905 A1 | 3/2019 | Park et al. |
| 2019/0157294 A1 | 5/2019 | Kanamori et al. |
| 2019/0244970 A1 | 8/2019 | Jung et al. |

* cited by examiner

SEMICONDUCTOR DEVICE

This application is a continuation of U.S. patent application Ser. No. 16/912,894, filed Jun. 26, 2020, in the U.S. Patent and Trademark Office, which claims the benefit of priority under 35 U.S.C. § 119 to Korean Patent Application No. 10-2019-0176457, filed on Dec. 27, 2019, in the Korean Intellectual Property Office, the disclosure of both which are incorporated herein in their entireties by reference.

BACKGROUND

1. Technical Field

The present disclosure relates to a semiconductor device.

2. Description of the Related Art

In order to satisfy superior performance and low price required by consumers, it is required to increase a degree of integration of semiconductor devices. In the case of the semiconductor device, since the degree of integration is an important factor for determining the price of a product, the increased degree of integration is particularly relevant. In the case of a two-dimensional or planar semiconductor device, since the degree of integration is mainly determined by an area occupied by a unit memory cell, the degree of integration is greatly affected by a level of a fine pattern formation technique.

However, since ultra-expensive apparatuses are required for miniaturization of the pattern, the degree of integration of the two-dimensional semiconductor device is increasing, but is still limited. Accordingly, three-dimensional semiconductor memory devices including memory cells disposed three-dimensionally have been proposed.

SUMMARY

Aspects of the present disclosure provide a semiconductor device which reduces the risk that may occur when forming an electrode isolation trench, without increasing an overall thickness of the semiconductor device, by forming a thickness of a supporter of a region in which the electrode isolation trench is formed to be thicker than a thickness of the supporter of a region in which a channel hole is formed.

According to an exemplary embodiment of the present disclosure, there is provided a semiconductor device, comprising a first substrate including a cell region and an extension region surrounding the cell region, a common source plate disposed on the first substrate, a supporter disposed on the common source plate, a first stack structure disposed on the supporter and including first insulating films and first gate electrode alternately stacked, a channel hole penetrating the first stack structure, the supporter, and the common source plate on the cell region of the first substrate, and an electrode isolation trench spaced apart from the channel hole in a first direction on the cell region of the first substrate, extending lengthwise in a second direction perpendicular to the first direction, and penetrating the first stack structure, the supporter, and the common source plate, wherein a first thickness of the supporter in a first region adjacent to the electrode isolation trench in the first direction is greater than a second thickness of the supporter in a second region formed between the electrode isolation trench and the channel hole.

According to an exemplary embodiment of the present disclosure, there is provided a semiconductor device, comprising a substrate having a first trench formed on an upper surface thereof, a common source plate disposed on the substrate and having a second trench formed on an upper surface thereof, a supporter disposed on the common source plate, a stack structure which is disposed on the supporter and including insulating films and gate electrodes alternately stacked, first and second channel holes, each penetrating the stack structure, the supporter, and the common source plate, and spaced apart from each other in a first direction, and an electrode isolation trench extending lengthwise in a second direction perpendicular to the first direction between the first channel hole and the second channel hole, and overlapping each of the first and second trenches in a third direction perpendicular to the first and second directions, wherein at least a part of the common source plate is disposed in the first trench, and wherein at least a part of the supporter is disposed in the second trench.

According to an exemplary embodiment of the present disclosure, there is provided a semiconductor device, comprising a substrate having a first trench formed on an upper surface thereof, a common source plate disposed on the substrate and having a second trench formed on an upper surface thereof, a supporter disposed on the common source plate, a stack structure disposed on the supporter and including insulating films and gate electrodes alternately stacked, first and second channel holes, each penetrating the stack structure, the supporter, and the common source plate, and spaced apart from each other in a first direction, a channel insulating film disposed along sidewalls and bottom surfaces of each of the first and second channel holes, a channel film disposed on the channel insulating film inside each of the first and second channel holes and being in contact with the common source plate, and an electrode isolation trench extending lengthwise in a second direction perpendicular to the first direction between the first channel hole and the second channel hole, and penetrating the stack structure, the supporter, and the common source plate, wherein the first trench, the second trench, and the electrode isolation trench overlap in a third direction perpendicular to the first and second directions, and wherein a first thickness of the supporter in a first region adjacent to the electrode isolation trench in the first direction is greater than a second thickness of the supporter in a second region formed between the electrode isolation trench and the first channel hole.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which like numbers refer to like elements throughout. In the drawings.

DETAILED DESCRIPTION

Figure 1:
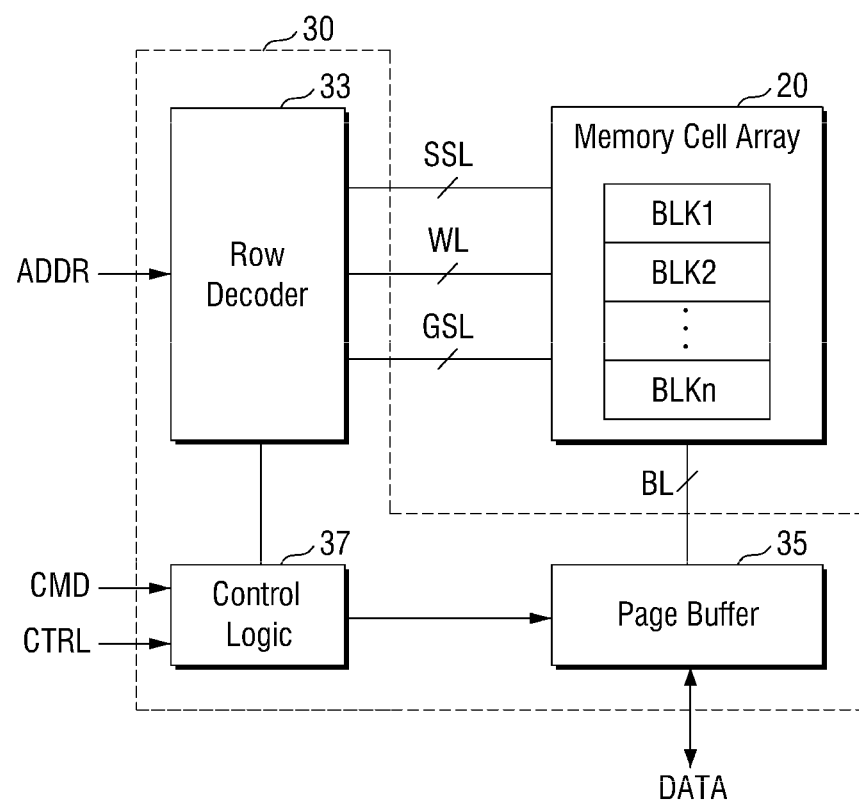
FIG. 1 is a block diagram for explaining a semiconductor device, according to embodiments of the present disclosure.

FIG. 1 is a block diagram for explaining a semiconductor device according to example embodiments of the present disclosure.

Referring to FIG. 1, a semiconductor device 10 according to example embodiments of the present disclosure may include a memory cell array 20 and a peripheral circuit 30.

The memory cell array 20 may include a plurality of memory cell blocks BLK1 to BLKn. Each of the memory cell blocks BLK1 or BLKn may include a plurality of memory cells. The memory cell blocks BLK1 to BLKn may be connected to a peripheral circuit 30 through bit lines BL, word lines WL, at least one string selection line SSL, and at least one ground selection line GSL.

Specifically, the memory cell blocks BLK1 to BLKn may be connected to a row decoder 33 through the word lines WL, at least one string selection line SSL, and at least one ground selection line GSL. Further, the memory cell blocks BLK1 to BLKn may be connected to a page buffer 35 through the bit lines BL.

The peripheral circuit 30 may receive an address ADDR, a command CMD, and a control signal CTRL from the outside of the semiconductor device 10, and may transmit and receive data DATA to and from a device outside the semiconductor device 10. The peripheral circuit 30 may include a control logic 37, a row decoder 33, and a page buffer 35. The row decoder 33 may receive the address ADDR, the control logic 37 may receive the command CMD and the control signal CTRL, and the page buffer 35 may transmit and receive the data DATA.

Although it is not shown, the peripheral circuit 30 may further include various sub-circuits such as an input/output circuit, a voltage generation circuit that generates various voltages necessary for the operation of the semiconductor device 10, and an error correction circuit for correcting errors of the data DATA read from the memory cell array 20.

The control logic 37 may be connected to the row decoder 33, the voltage generator, and the input/output circuit. The control logic 37 may control the overall operation of the semiconductor device 10. The control logic 37 may generate various internal control signals used in the semiconductor device 10 in response to a received control signal CTRL. For example, the control logic 37 adjusts a voltage level provided to the word lines WL and the bit lines BL when performing a memory operation such as a program operation or an erase operation.

The row decoder 33 may select at least one of the plurality of memory cell blocks BLK1 to BLKn in response to the received address ADDR, and may select at least one word line WL, at least one string selection line SSL, and at least one ground selection line GSL of the selected memory cell blocks BLK1 to BLKn. The row decoder 33 may transfer a voltage for executing the memory operation to the word line WL of the selected memory cell blocks BLK1 to BLKn.

The page buffer 35 may be connected to the memory cell array 20 through the bit lines BL. The page buffer 35 may operate as a write driver or a sense amplifier. Specifically, at the time of the program operation, the page buffer 35 may operate as the write driver to apply a voltage according to data DATA to be stored in the memory cell array 20 to the bit lines BL. On the other hand, at the time of the read operation, the page buffer 35 may operate as the sense amplifier to sense the data DATA stored in the memory cell array 20.

Figure 2:
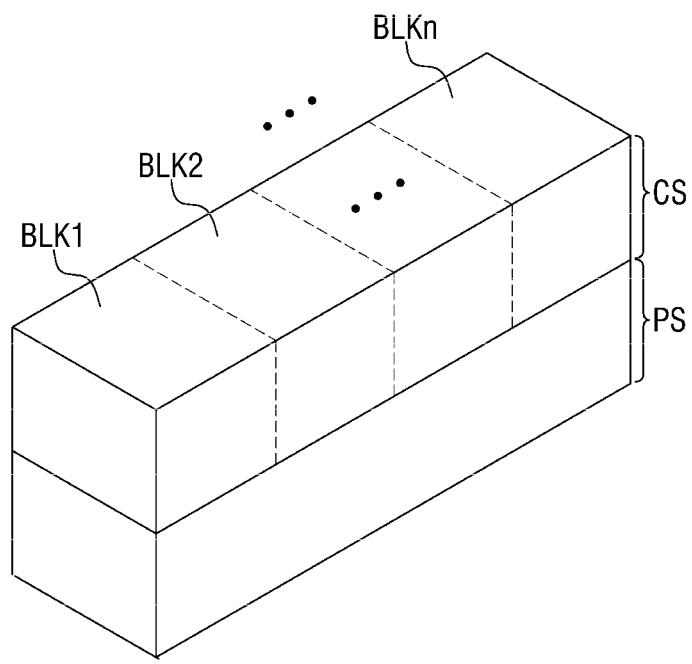
FIG. 2 is a schematic perspective view for explaining the semiconductor device, according to embodiments of the present disclosure.

FIG. 2 is a schematic perspective view for explaining the semiconductor device according to example embodiments of the present disclosure.

Referring to FIG. 2, the semiconductor device according to example embodiments of the present disclosure may include a peripheral logic structure PS and a cell array structure CS.

The cell array structure CS may be stacked on the peripheral logic structure PS. For example, the peripheral logic structure PS and the cell array structure CS may overlap from a planar viewpoint. The semiconductor device according to some embodiments of the present disclosure may have a COP (Cell Over Peri) structure.

For example, the cell array structure CS may include the memory cell array 20 of FIG. 1. The peripheral logic structure PS may include the peripheral circuit 30 of FIG. 1.

The cell array structure CS may include a plurality of memory cell blocks BLK1 to BLKn disposed on the peripheral logic structure PS.

Figure 3:
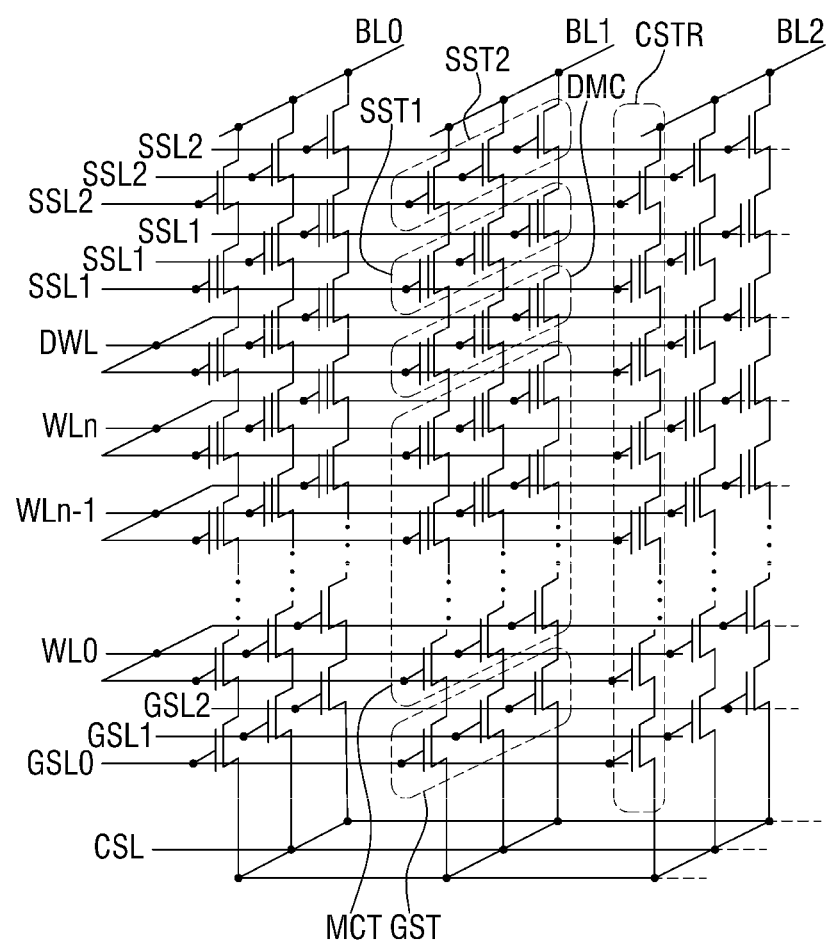
FIG. 3 is a circuit diagram for explaining one memory cell block of a plurality of memory cell blocks included in the semiconductor device, according to embodiments of the present disclosure.

FIG. 3 is a circuit diagram for explaining one memory cell block of a plurality of memory cell blocks included in the semiconductor device according to example embodiments of the present disclosure.

Referring to FIG. 3, the memory cell block according to example embodiments of the present disclosure may include a common source line CSL, a plurality of bit lines BL, and a plurality of cell strings CSTR disposed between the common source line CSL and the bit lines BL.

A plurality of cell strings CSTR may be connected in parallel to each of the bit lines BL0 to BL2. The plurality of cell strings CSTR may be commonly connected to the common source line CSL. For example, the plurality of cell strings CSTR may be disposed between the plurality of bit lines BL0 to BL2 and the single common source line CSL. A plurality of common source lines CSL may be disposed two-dimensionally. Here, the same voltage may be electrically applied to the common source lines CSL or each of the common source lines CSL may be electrically controlled.

For example, each of the cell strings CSTR may be formed by serially-connected string selection transistors SST1 and SST2, serially-connected memory cells MCT, and a ground selection transistor GST. Further, each of the memory cells MCT includes a data storage element.

In some embodiments, each cell string CSTR may include serially-connected first and second string selection transistors SST1 and SST2, where the second string selection transistor SST2 may be connected to the bit lines BL0 to BL2, and the ground selection transistor GST may be connected to the common source line CSL. The memory cells MCT may be connected in series between the first string selection transistor SST1 and the ground selection transistor GST.

Also, each of the cell strings CSTR may further include a dummy cell DMC connected between the first string selection transistor SST1 and an uppermost one of the memory cells MCT. Although it is not shown in the drawings, the dummy cell DMC may also be connected between the ground selection transistor GST and a lowermost one of the memory cells MCT. In some other embodiments, the ground selection transistor GST in each cell string CSTR may include a plurality of MOS transistors connected in series, similarly to the first and second string selection transistors SST1 and SST2. In some other embodiments, each of the cell strings CSTR may include a single string selection transistor.

In some embodiments, the first string selection transistor SST1 may be controlled by the first string selection line SSL1, and the second string selection transistor SST2 may be controlled by the second string selection line SSL2. The memory cells MCT may be controlled by a plurality of word lines WL0 to WLn, and the dummy cells DMC may be controlled by a dummy word line DWL. Also, the ground selection transistor GST may be controlled by the ground selection line GSL. The common source line CSL may be commonly connected to the sources of the ground selection transistors GST.

The single cell string CSTR may be made up of a plurality of memory cells MCT having different distances from the common source lines CSL. Further, a plurality of word lines WL0 to WLn and DWL may be disposed between the common source lines CSL and the bit lines BL0 to BL2.

The gate electrodes of the memory cells MCT, which are disposed at substantially the same distance from the common source line CSL, are commonly connected to one of the word lines WL0 to WLn and DWL, and may be in an equipotential state. In contrast, even if the gate electrodes of the memory cells MCT are disposed at substantially the same level from the common source lines CSL, the gate electrodes disposed in different rows or columns may be controlled independently.

The ground selection lines GSL0 to GSL2 and the string selection lines SSL1 and SSL2 may extend, for example, in the same direction as the word lines WL0 to WLn and DWL. The ground selection lines GSL0 to GSL2 and the string selection lines SSL1 and SSL2 disposed at substantially the same level from the common source lines CSL may be electrically separated from each other.

Hereinafter, a semiconductor device according to example embodiments of the present disclosure will be explained with reference to FIGS. 4 to 6.

Figure 4:
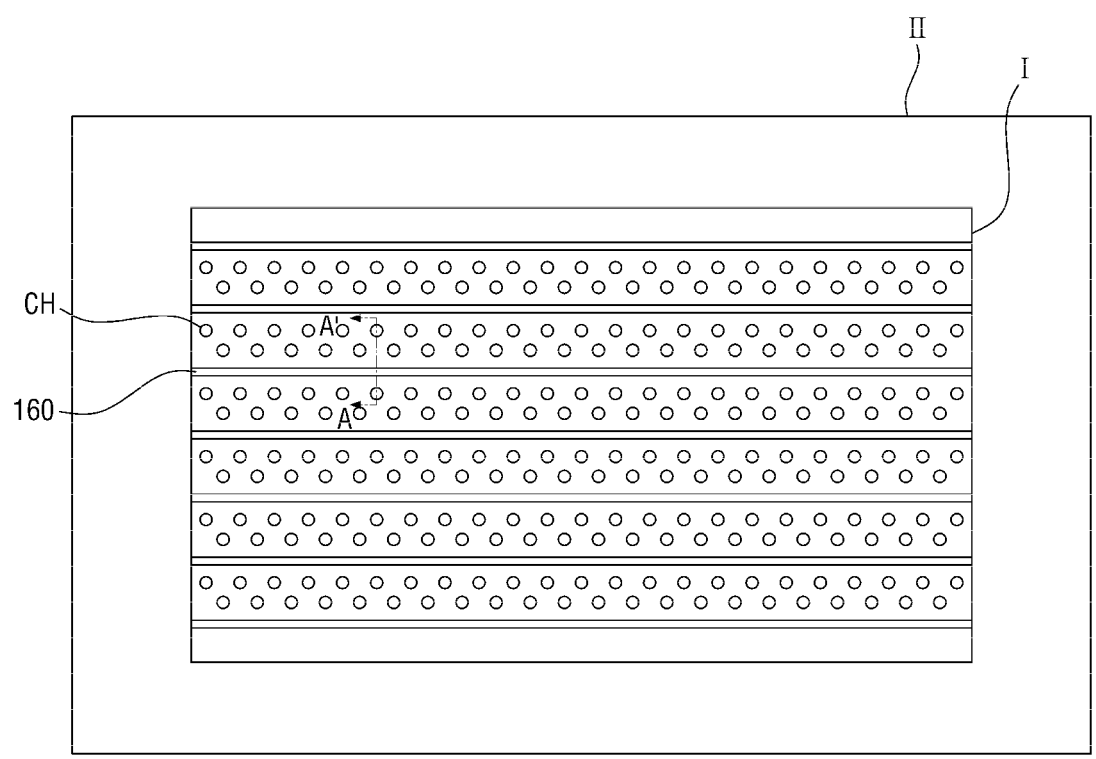
FIG. 4 is a layout diagram for explaining the semiconductor device, according to embodiments of the present disclosure.

FIG. 4 is a layout diagram for explaining a semiconductor device according to example embodiments of the present disclosure. FIG. 5 is a cross-sectional view taken along a line A-A' of FIG. 4. FIG. 6 is an enlarged view of a region B of FIG. 5.

Figure 5:
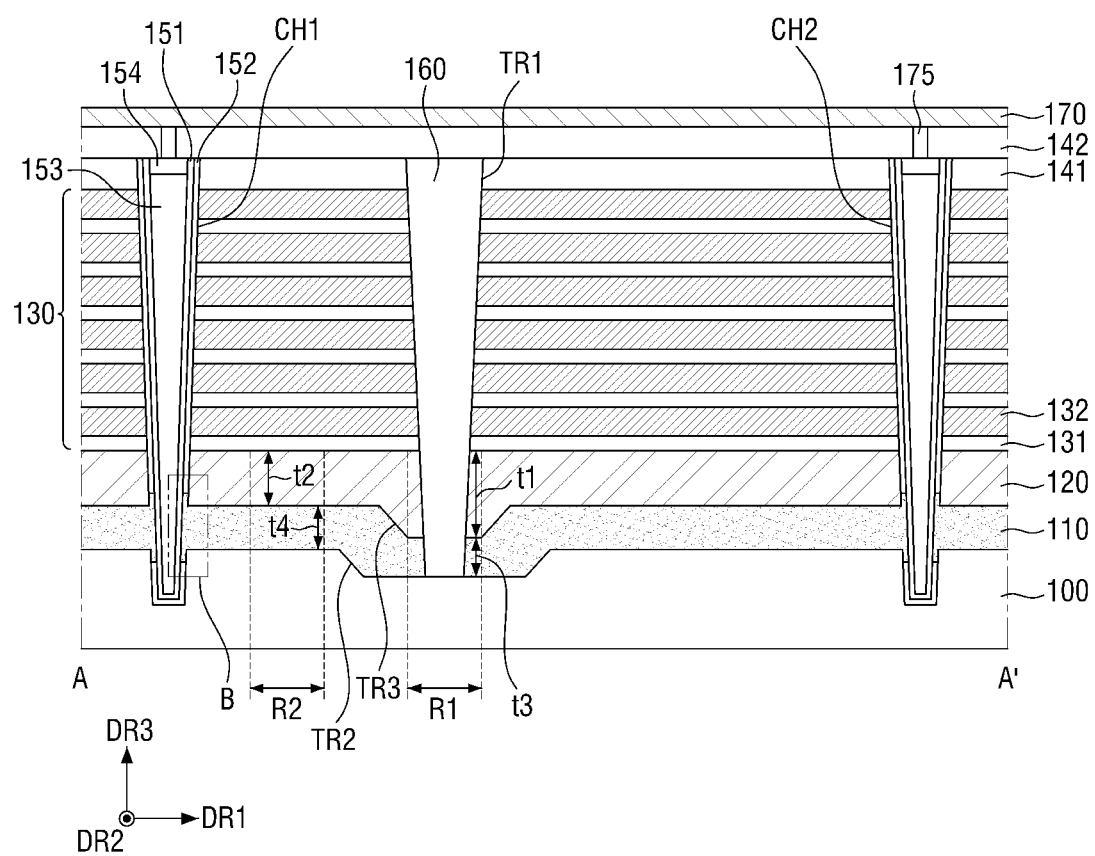
FIG. 5 is a cross-sectional view taken along a line A-A' of FIG. 4.
Figure 6:
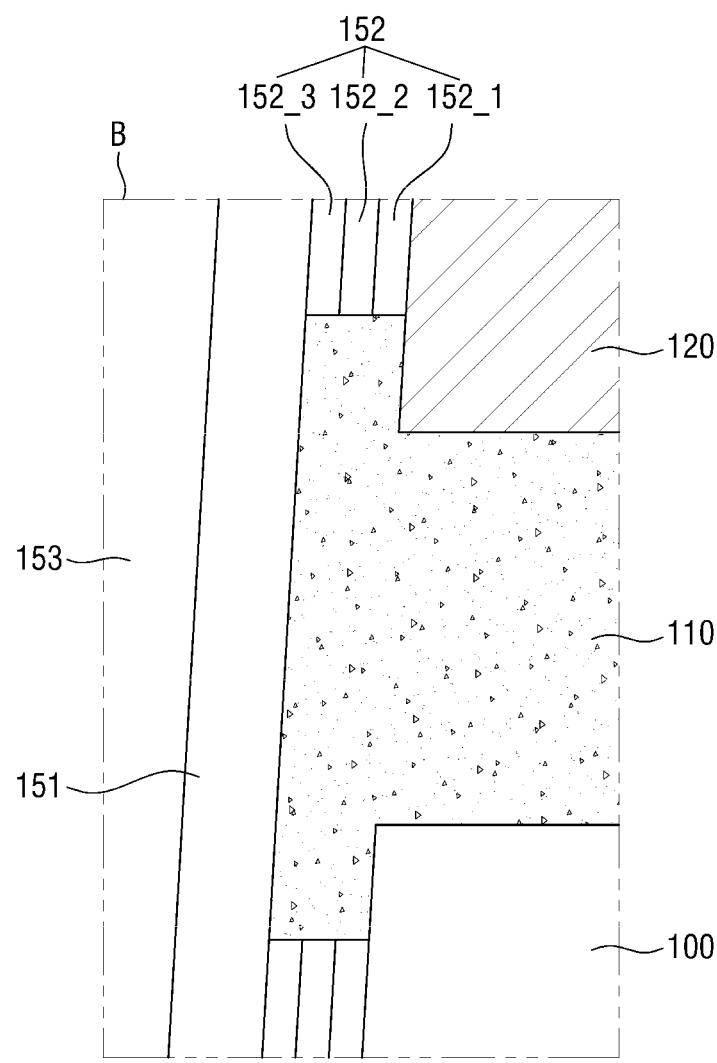
FIG. 6 is an enlarged view of a region B of FIG. 5.

Referring to FIGS. 4 to 6, the semiconductor device according to example embodiments of the present disclosure includes a first substrate 100, a common source plate 110, a supporter 120, a first stack structure 130, a first interlayer insulating film 141, a second interlayer insulating film 142, a channel film 151, a channel insulating film 152, a channel filling film 153, a conductive pad 154, an electrode isolation film 160, a bit line 170 and a bit line contact 175.

The first substrate 100 may include a cell region I and an extension region II. The cell region I may include a plurality of channel holes CH and a plurality of electrode isolation films 160.

Each of the plurality of electrode isolation films 160 may be spaced apart from each other in a first direction DR1. Each of the plurality of electrode isolation films 160 may extend lengthwise in a second direction DR2 perpendicular to the first direction DR1. An item, layer, or portion of an item or layer described as extending "lengthwise" in a particular direction has a length in the particular direction and a width perpendicular to that direction, where the length is greater than the width.

Each of the plurality of channel holes CH may be disposed between the plurality of electrode isolation films 160. Each of the plurality of channel holes CH may extend lengthwise in a third direction DR3 perpendicular to the first and second directions DR1 and DR2. A channel may be formed inside each of the plurality of channel holes CH.

The extension region II may be disposed to surround the cell region I. Although it is not shown in FIG. 4, a stack structure stacked in the third direction DR3 and having a staircase structure may be disposed in the extension region II.

The first substrate 100 may be bulk silicon or a SOI (silicon-on-insulator). Alternatively, although the first substrate 100 may be a silicon substrate or may include other materials, for example, silicon germanium, SGOI (silicon germanium on insulator), indium antimonide, lead telluride, indium arsenide, indium phosphorus, gallium arsenide or gallium antimonide, the present disclosure is not limited thereto.

A first trench TR2 may be formed on an upper surface of the first substrate 100. Sidewalls of the first trench TR2 may have a slope profile. For example, a width of the first trench TR2 in the first direction DR1 may increase as it comes closer to the first stack structure 130. The first trench TR2 may extend lengthwise in the second direction DR2. A bottom surface of the first trench TR2 may be planar and parallel to an upper surface of the first substrate 100, and the sidewalls of the first trench TR2 may be planar and formed at an angle to the upper surface of the first substrate 100. The sidewalls of the first trench TR2 may extend from the bottom surface of the first trench TR2 to the upper surface of the first substrate 100.

The common source plate 110 may be disposed on the first substrate 100. The common source plate 110 may be formed in each of the cell region I and the extension region II.

The common source plate 110 may be disposed on the first substrate 100 in a two-dimensional plane shape. However, the present disclosure is not limited thereto. For example, in some other embodiments, the common source plate 110 may have a line shape extending in the first direction DR1.

At least a part of the common source plate 110 may be disposed inside the first trench TR2. A second trench TR3 may be formed on the upper surface of the common source plate 110.

The second trench TR3 may overlap the first trench TR2 in the third direction DR3. Sidewalls of the second trench TR3 may have a slope profile. For example, a width of the second trench TR3 in the first direction DR1 may increase as it comes closer to the first stack structure 130. The second trench TR3 may extend lengthwise in the second direction DR2. A bottom surface of the second trench TR3 may be planar and parallel to an upper surface of the first substrate 100, and the sidewalls of the second trench TR3 may be planar and formed at an angle to the upper surface of the first substrate 100. The sidewalls of the second trench TR3 may extend from the bottom surface of the second trench TR3 to an upper surface of the common source plate 110. The bottom surface of the second trench TR3 may be at a higher vertical level (in the third direction DR3) than the upper surface of the first substrate 100. In some embodiments, the angle of the sidewalls of the first trench TR2 and the angle of the sidewalls of the second trench TR3 may be the same.

The common source plate 110 may perform the function of the common source line CSL of FIG. 3.

The common source plate 110 may include, for example, polysilicon. However, the present disclosure is not limited thereto. For example, in some other embodiments, the common source plate 110 may include, for example, at least one of silicon (Si), germanium (Ge), silicon germanium (SiGe), gallium arsenide (GaAs), indium gallium arsenide (InGaAs), aluminum gallium arsenide (AlGaAs), or mixtures thereof.

The supporter 120 may be disposed on the common source plate 110. The supporter 120 and the common source plate 110 may be formed in the cell region I and the extension region II, respectively.

The supporter 120 may be disposed on the common source plate 110 in a two-dimensional plane shape. However, the present disclosure is not limited thereto. For example, in some other embodiments, the supporter 120 may have a line shape extending in the first direction DR1. At least a part of the supporter 120 may be disposed inside the second trench TR3.

Although the supporter 120 may include, for example, polysilicon, the present disclosure is not limited thereto. For example, in some other embodiments, the supporter 120 may include a semiconductor material such as, for example, silicon (Si), germanium (Ge), or a mixture thereof.

The thickness of the supporter 120 in the third direction DR3 may be formed to be relatively large in a region adjacent to the electrode isolation trench TR1. Thickness may refer to the thickness or height measured in a direction perpendicular to a top surface of the first substrate 100 (e.g., the third direction DR3). For example, a first thickness t1 of the supporter 120 in the third direction DR3 in a first region R1 adjacent to the electrode isolation trench TR1 in the first direction DR1 may be greater than a second thickness t2 of the supporter 120 in the third direction DR3 in a second region R2 formed between the electrode isolation trench TR1 and the first channel hole CH1. The upper surface of the supporter 120 in the first region R1 may be at the same vertical level as the upper surface of the supporter 120 in the second region R2.

Here, the first region R1 is defined as a region which overlaps each of the first trench TR2 and the second trench TR3 in the third direction DR3. For example, the first region R1 may be the region where the bottom surface of the second trench TR3 overlaps the bottom surface of the first trench TR1. Also, the second region R2 is defined as a region that does not overlap either of the first trench TR2 and the second trench TR3 in the third direction DR3. The first region R1 may include a part of the common source plate 110 and a part of the supporter 120 that overlap the second trench TR3 in the third direction DR3.

The common source plate 110 may be, for example, conformally disposed on the first substrate 100. For example, the thickness of the common source plate 110 in the third direction DR3 may be formed uniformly. For example, a third thickness t3 of the common source plate 110 in the third direction DR3 in the first region R1 adjacent to the electrode isolation trench TR1 in the first direction DR1 may be the same as a fourth thickness t4 of the common source plate 110 in the third direction DR3 in the second region R2 formed between the electrode isolation trench TR1 and the first channel hole CH1. However, the present disclosure is not limited thereto.

The first stack structure 130 may be located on the supporter 120. The first stack structure 130 may include a plurality of first insulating films 131 and a plurality of first gate electrodes 132 that are alternately stacked.

Although FIG. 5 shows that six first insulating films 131 and six first gate electrodes 132 are alternately stacked, this is for convenience of explanation, and the numbers of each of the first insulating film 131 and the first gate electrode 132 included in the first stack structure 130 are not limited.

Also, although FIG. 5 shows that the first gate electrode 132 is disposed to be the uppermost layer of the first stack structure 130, the present disclosure is limited thereto. For example, in some other embodiments, the first insulating film 131 may be disposed to be the uppermost layer of the first stack structure 130.

Each of the plurality of first gate electrodes 132 may have the same length in the first direction DR1 and the second direction DR2 on the cell region I. In some embodiments, each of the plurality of first gate electrodes 132 may have a staircase shape in which the length in the first direction DR1 decreases as it comes closer to the bit line 170 on the extension region II. In some other embodiments, each of the plurality of first gate electrodes 132 may have a staircase shape in which each of the length in the first direction DR1 and the length in the second direction DR2 decreases as it comes closer to the bit line 170 on the extension region II.

The first insulating film 131 may include an insulating material, for example, at least one of a low dielectric constant material, an oxide film, a nitride film, and an oxynitride film.

The first gate electrode 132 may include a conductive material. Although the first gate electrode 132 may include, for example, a conductive material such as tungsten (W), cobalt (Co), and nickel (Ni) or a semiconductor material such as silicon, the present disclosure is not limited thereto.

The first interlayer insulating film 141 may be disposed on the first stack structure 130. The first interlayer insulating film 141 may be disposed on the upper surface of the first stack structure 130 on the cell region I, contacting the uppermost layer of the first stack structure 130. The first interlayer insulating film 141 may be disposed on a side surface of the first stack structure 130 on the extension region II, contacting side surfaces of the layers of the first stack structure 130.

The first interlayer insulating film 141 may include an insulating material, for example, at least one of a low dielectric constant material, an oxide film, a nitride film, and an oxynitride film.

Each of the first channel hole CH1 and the second channel hole CH2 may sequentially penetrate the first interlayer insulating film 141, the first stack structure 130, the supporter 120, and the common source plate 110 in the third direction DR3 on the cell region I, and may extend into the first substrate 100. For example, each of the first channel hole CH1 and the second channel hole CH2 may extend to a vertical level lower than the upper surface of the first substrate 100.

A channel insulating film 152, a channel film 151, a channel filling film 153, and a conductive pad 154 may be disposed inside each of the first channel hole CH1 and the second channel hole CH2.

The channel insulating film 152 may be disposed along sidewalls and bottom surfaces of each of the first channel hole CH1 and the second channel hole CH2. As shown in FIG. 6, the channel insulating film 152 may include a blocking insulating film 152_1, a charge storage film 152_2, and a tunnel insulating film 152_3. The blocking insulating film 152_1, the charge storage film 152_2, and the tunnel insulating film 152_3 may be sequentially stacked on sidewalls and bottom surfaces of each of the first channel hole CH1 and the second channel hole CH2.

The tunnel insulating film 152_3 may, for example, allow charges to pass between the channel film 151 and the charge storage film 152_2. The charge storage film 152_2 may store charges having passed through the tunnel insulating film 152_3, for example, between the blocking insulating film 152_1 and the tunnel insulating film 152_3. The blocking insulating film 152_1 may prevent, for example, charges captured by the charge storage film 152_2 from being emitted to the first gate electrode 132.

The channel film 151 may be disposed on the channel insulating film 152 inside each of the first channel hole CH1 and the second channel hole CH2. As shown in FIG. 6, the common source plate 110 extends inside each of the first channel hole CH1 and the second channel hole CH2, and may be brought into contact with the channel film 151. In this case, a part of the common source plate 110 may extend into each of the first channel hole CH1 and the second channel hole CH2 along the channel film 151. The part of the common source plate 110 that extends into each of the first channel hole CH1 and the second channel hole CH2 may include an upper extended portion and a lower extended portion. The upper extended portion may extend to a vertical level higher than an upper surface of the common source plate 110 located between the first substrate 100 and the supporter 120, and the lower extended portion may extend to a vertical level lower than a lower surface of the common source plate 110 located between the first substrate 100 and the supporter 120. The channel insulating film 152 may be separated by the common source plate 110.

The channel film 151 may function as a channel region. The channel film 151 may provide charges to be trapped or emitted by the channel insulating film 152.

The channel film 151 may include a semiconductor material such as, for example, silicon (Si), germanium (Ge) or a mixture thereof. Further, the channel film 151 may include a metal oxide semiconductor material.

The channel filling film 153 may be disposed on the channel film 151 to fill the inside of each of the first channel hole CH1 and the second channel hole CH2. The channel filling film 153 may include an insulating material.

The conductive pad 154 may be disposed on the channel filling film 153 inside each of the first channel hole CH1 and the second channel hole CH2. The upper surface of the conductive pad 154 may be formed on the same plane as the upper surface of the first interlayer insulating film 141. The upper surface of the conductive pad 154 may be formed on the same plane as each of the upper surface of the channel film 151 and the upper surface of the channel insulating film 152. However, the present disclosure is not limited thereto. For example, in some other embodiments, the conductive pad 154 may be in contact with each of a sidewall of the first channel hole CH1 and a sidewall of the second channel hole CH2. The conductive pad 154 may function as a bit line pad.

The electrode isolation trench TR1 may be formed between the first channel hole CH1 and the second channel hole CH2 on the cell region I. The electrode isolation trench TR1 may be spaced apart from each of the first channel hole CH1 and the second channel hole CH2 in the first direction DR1. The electrode isolation trench TR1 may be formed in the first region R1. The electrode isolation trench TR1 may extend lengthwise in the second direction DR2.

The electrode isolation trench TR1 may sequentially penetrate the first interlayer insulating film 141, the first stack structure 130, the supporter 120, and the common source plate 110 in the third direction DR3. In this case, the electrode isolation trench TR1 may penetrate the common source plate 110 disposed inside the first trench TR2 and the supporter 120 disposed inside the second trench TR3.

Although FIG. 5 shows that the lower surface of the electrode isolation trench TR1 and the lower surface of the first trench TR2 are formed on the same plane, the present disclosure is not limited thereto.

The electrode isolation film 160 may be disposed to fill the inside of the electrode isolation trench TR1. The electrode isolation film 160 may be in contact with each of the common source plate 110, the supporter 120, and the first stack structure 130. For example, side surfaces of the electrode isolation film 160 may contact side surfaces of the common source plate 110, the supporter 120, and the first stack structure 130.

The electrode isolation film 160 may include an insulating material, for example, at least one of a low dielectric constant material, an oxide film, a nitride film, and an oxynitride film.

The second interlayer insulating film 142 may be disposed on the first interlayer insulating film 141. The second interlayer insulating film 142 may include an insulating material, for example, at least one of a low dielectric constant material, an oxide film, a nitride film and an oxynitride film.

The bit line 170 may be disposed on the second interlayer insulating film 142. The bit line 170 may extend lengthwise in the first direction DR1. The bit line 170 may be electrically connected to the conductive pad 154 through a bit line contact 175 penetrating the second interlayer insulating film 142 in the third direction DR3.

In the semiconductor device according to example embodiments of the present disclosure, by forming the thickness of the supporter 120 in the region in which the electrode isolation trench TR1 is formed to be thicker than the thickness of the supporter 120 in the region in which the channel holes CH1 and CH2 are formed, it is possible to reduce the risk that may occur when forming the electrode isolation trench TR1, without increasing the overall thickness of the semiconductor device.

Hereinafter, the semiconductor device according to example embodiments of the present disclosure will be explained with reference to FIG. 7. Differences from the semiconductor device shown in FIG. 5 will be mainly explained.

Figure 7:
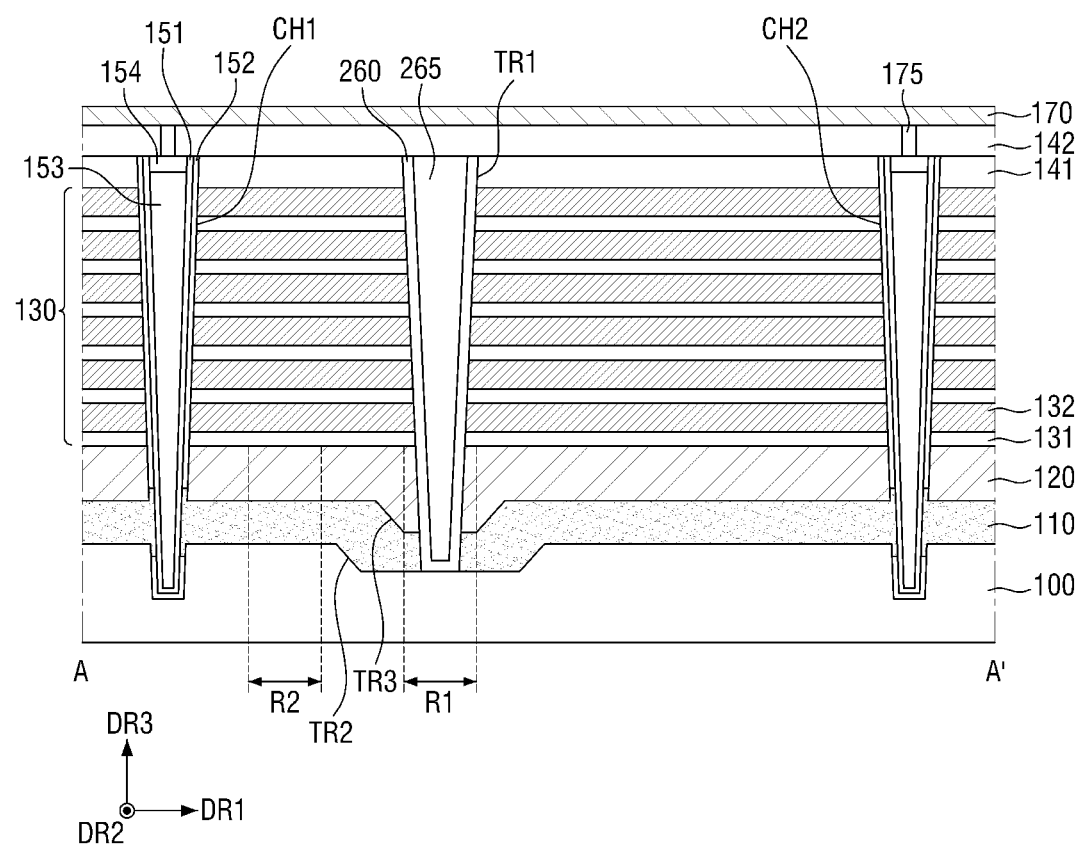
FIG. 7 is a cross-sectional view for explaining a semiconductor device, according to exemplary embodiments of the present disclosure.

FIG. 7 is a cross-sectional view for explaining the semiconductor device according to example embodiments of the present disclosure.

Referring to FIG. 7, in the semiconductor device according to example embodiments of the present disclosure, an electrode film 260 and an electrode isolation filling film 265 may be disposed inside the electrode isolation trench TR1.

The electrode film 260 may be disposed along a sidewall and a bottom surface of the electrode isolation trench TR1. The electrode isolation filling film 265 may be disposed on the electrode film 260 to fill the electrode isolation trench TR1. The electrode isolation filling film 265 may include, for example, at least one of tungsten (W) and polysilicon. However, the present disclosure is not limited thereto.

Hereinafter, a semiconductor device according to example embodiments of the present disclosure will be explained with reference to FIG. 8. Differences from the semiconductor device shown in FIG. 5 will be mainly explained.

Figure 8:
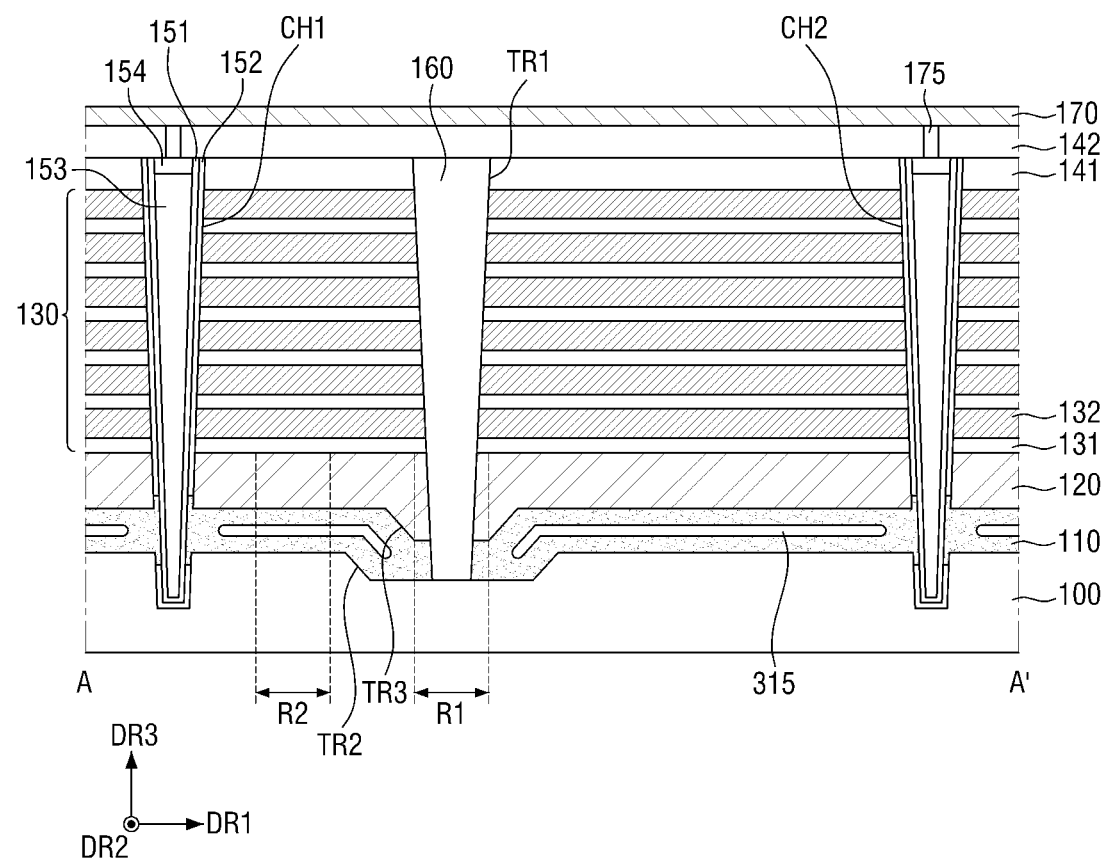
FIG. 8 is a cross-sectional view for explaining a semiconductor device, according to exemplary embodiments of the present disclosure.

FIG. 8 is a cross-sectional view for explaining a semiconductor device according to example embodiments of the present disclosure.

Referring to FIG. 8, in the semiconductor device according to example embodiments of the present disclosure, an air gap 315 may be formed inside the common source plate 110. The air gap 315 may extend between a sidewall of the first trench TR2 and a sidewall of the second trench TR3.

The air gap 315 may be formed along profiles of the upper surface of the first substrate 100 and the sidewall of the first trench TR2. For example, the air gap 315 may include a portion that is bent to correspond to the portion in which the upper surface of the first substrate 100 and the sidewall of the first trench TR2 are in contact with each other. In some embodiments, the air gap 315 in the third direction DR3 may have a uniform thickness.

Hereinafter, a semiconductor device according to example embodiments of the present disclosure will be explained with reference to FIG. 9. Differences from the semiconductor device shown in FIG. 5 will be mainly explained.

Figure 9:
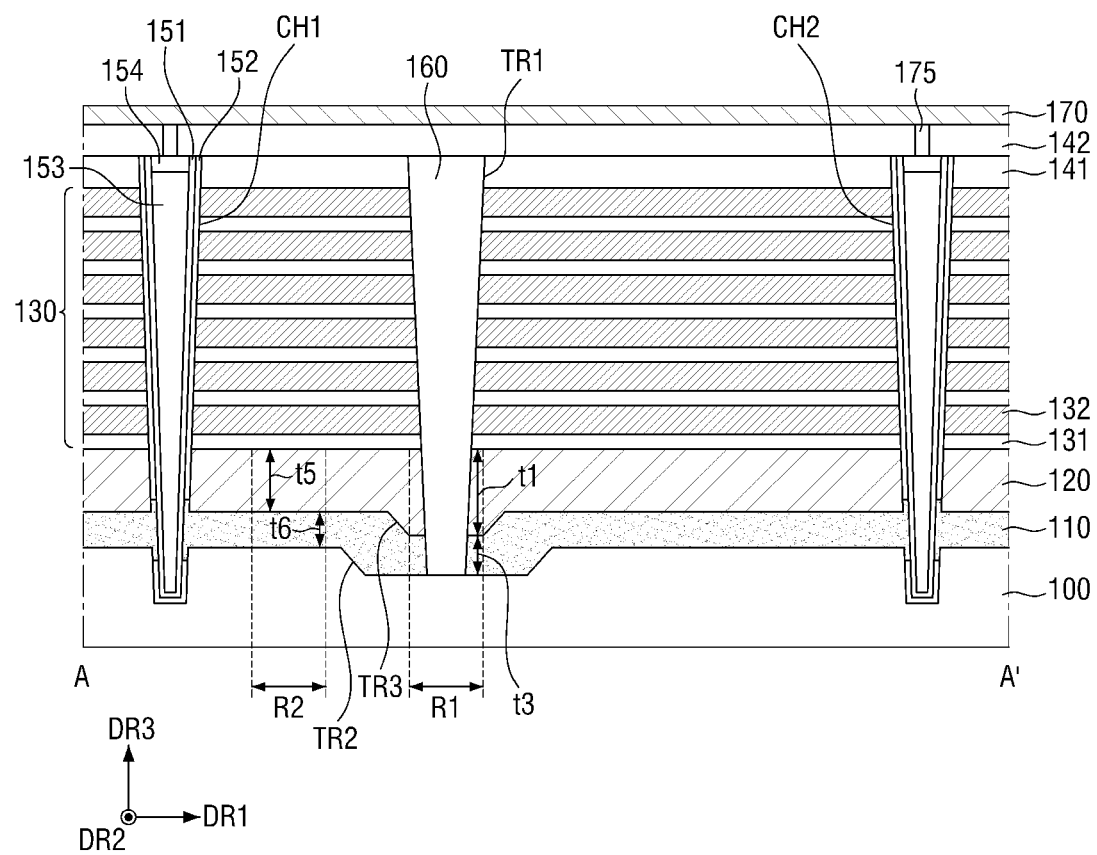
FIG. 9 is a cross-sectional view for explaining a semiconductor device, according to exemplary embodiments of the present disclosure.

FIG. 9 is a cross-sectional view for explaining the semiconductor device according to example embodiments of the present disclosure.

Referring to FIG. 9, in the semiconductor device according to example embodiments of the present disclosure, a thickness of the common source plate 110 in the third direction DR3 may be formed to be relatively greater inside the first trench TR2.

A first thickness t1 of the supporter 120 in the third direction DR3 in the first region R1 adjacent to the electrode isolation trench TR1 in the first direction DR1 may be greater than a fifth thickness t5 of the supporter 120 in the third direction DR3 in the second region R2 formed between the electrode isolation trench TR1 and the first channel hole CH1.

A third thickness t3 of the common source plate 110 in the third direction DR3 in the first region R1 adjacent to the electrode isolation trench TR1 in the first direction DR1 may be greater than a sixth thickness T6 of the common source plate 110 in the third direction DR3 in the second region R2 formed between the electrode isolation trench TR1 and the first channel hole CH1.

Hereinafter, the semiconductor device according to example embodiments of the present disclosure will be explained with reference to FIG. 10. Differences from the semiconductor device shown in FIG. 5 will be mainly explained.

Figure 10:
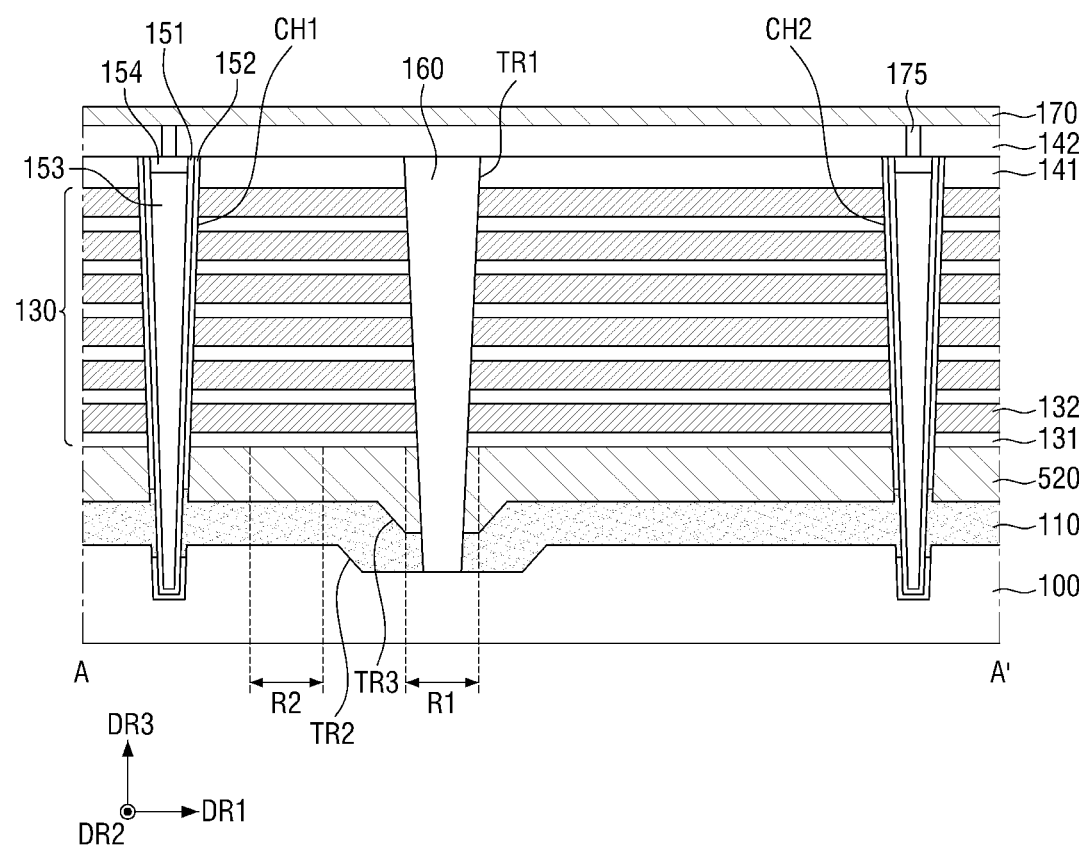
FIG. 10 is a cross-sectional view for explaining a semiconductor device, according to exemplary embodiments of the present disclosure.

FIG. 10 is a cross-sectional view for explaining the semiconductor device according to example embodiments of the present disclosure.

Referring to FIG. 10, in the semiconductor device according to example embodiments of the present disclosure, the supporter 520 may include an impurity. The impurity doped in the supporter 520 may be, for example, carbon (C). However, the present disclosure is not limited thereto. For example, in some other embodiments, the impurity doped in the supporter 520 may be either nitrogen (N) or phosphorus (P).

Hereinafter, the semiconductor device according to example embodiments of the present disclosure will be explained with reference to FIG. 11. Differences from the semiconductor device shown in FIG. 5 will be mainly explained.

Figure 11:
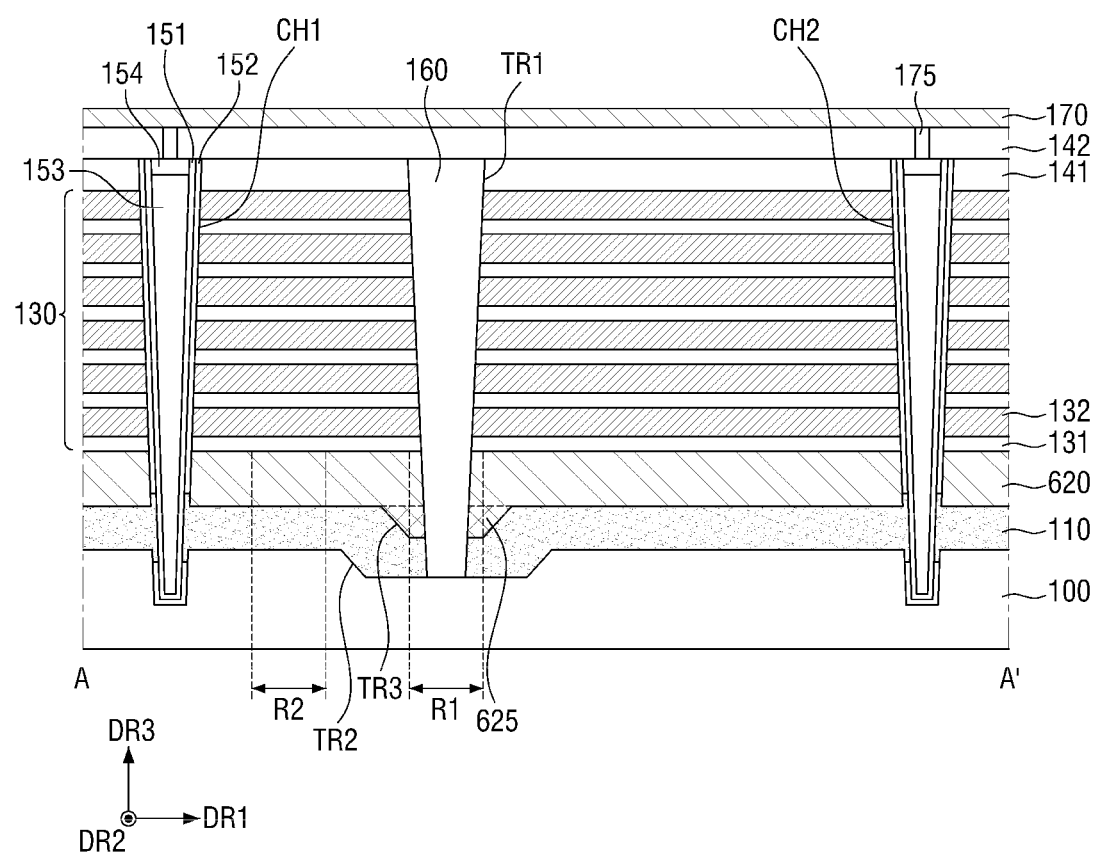
FIG. 11 is a cross-sectional view for explaining a semiconductor device, according to exemplary embodiments of the present disclosure.

FIG. 11 is a cross-sectional view for explaining a semiconductor device according to example embodiments of the present disclosure.

Referring to FIG. 11, the semiconductor device according to example embodiments of the present disclosure may include a first supporter 625 and a second supporter 620 including impurities of different concentrations.

The first supporter 625 may be disposed inside the second trench TR3. The first supporter 625 may include an impurity of a first concentration. The second supporter 620 may be disposed on the first supporter 625. The second supporter 620 may include an impurity of a second concentration greater than the first concentration.

The impurity doped in each of the first supporter 625 and the second supporter 620 may be, for example, carbon (C). However, the present disclosure is not limited thereto. For example, in some other embodiments, the impurity doped in each of the first supporter 625 and the second supporter 620 may be either nitrogen (N) or phosphorus (P).

Hereinafter, a semiconductor device according to example embodiments of the present disclosure will be explained with reference to FIG. 12. Differences from the semiconductor device shown in FIG. 5 will be mainly explained.

Figure 12:
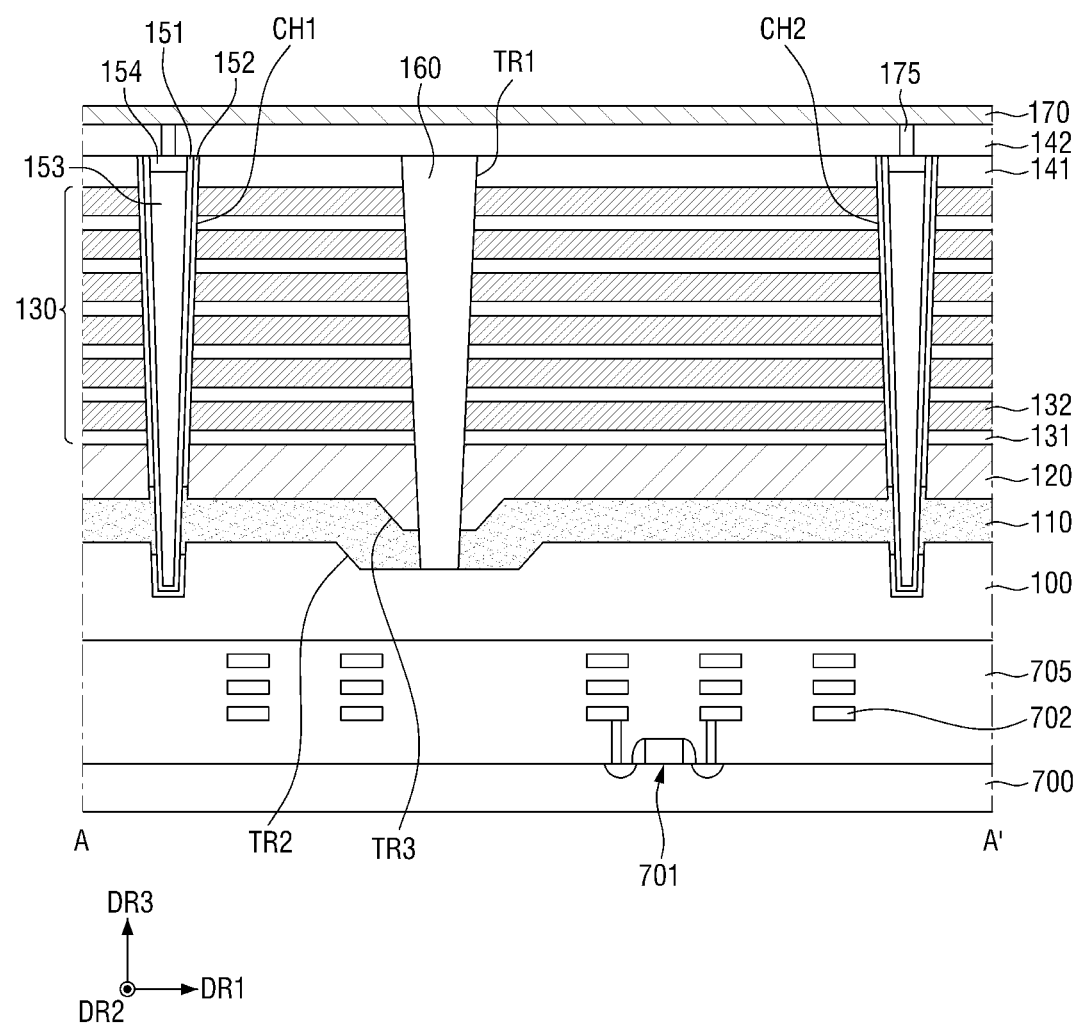
FIG. 12 is a cross-sectional view for explaining a semiconductor device, according to exemplary embodiments of the present disclosure.

FIG. 12 is a cross-sectional view for explaining a semiconductor device according to example embodiments of the present disclosure.

Referring to FIG. 12, in the semiconductor device according to example embodiments of the present disclosure, a peripheral circuit region may be disposed below the first substrate 100. For example, the peripheral circuit region may overlap the cell region I in the third direction DR3.

Specifically, the semiconductor device according to example embodiments of the present disclosure may include a second substrate 700, a transistor 701, a plurality of wirings 702, and a third interlayer insulating film 705.

The second substrate 700 may be located below the first substrate 100. The transistor 701 may be disposed on the second substrate 700. The third interlayer insulating film 705 may be disposed between the second substrate 700 and the first substrate 100. The plurality of wirings 702 may be disposed inside the third interlayer insulating film 705 and be electrically connected to the transistor 701.

Hereinafter, a semiconductor device according to example embodiments of the present disclosure will be explained with reference to FIG. 13. Differences from the semiconductor device shown in FIG. 5 will be mainly explained.

Figure 13:
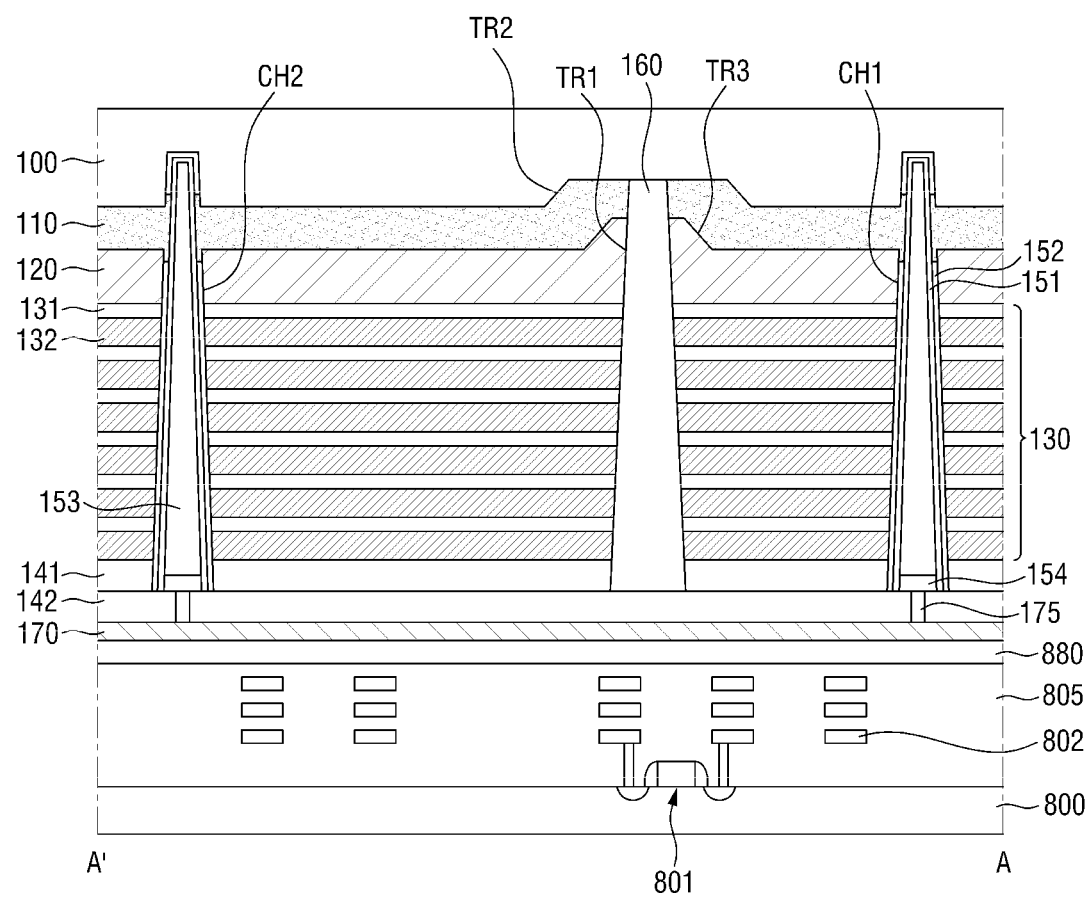
FIG. 13 is a cross-sectional view for explaining a semiconductor device, according to exemplary embodiments of the present disclosure.
Figure 13:
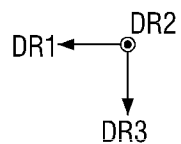

FIG. 13 is a cross-sectional view for explaining a semiconductor device according to example embodiments of the present disclosure.

Referring to FIG. 13, in the semiconductor device according to example embodiments of the present disclosure, a peripheral circuit region may be disposed on the bit line 170. For example, the peripheral circuit region may overlap the cell region I in the third direction DR3. The cell region I of the semiconductor device shown in FIG. 13 may have a structure in which the cell region I of the semiconductor device shown in FIG. 12 is turned upside down.

Specifically, the semiconductor device according to example embodiments of the present disclosure may include a second substrate 800, a transistor 801, a plurality of wirings 802, a third interlayer insulating film 805, and a connection line 880.

In the drawing shown in FIG. 13, the second substrate 800 may be disposed below the bit line 170. The transistor 801 may be disposed on the second substrate 800. The third interlayer insulating film 805 may be disposed between the second substrate 800 and the bit line 170. The plurality of wirings 802 may be disposed inside the third interlayer insulating film 805 and be electrically connected to the transistor 801.

The connection line 880 may be disposed between the bit line 170 and the third interlayer insulating film 805. The connection line 880 may electrically connect the bit line 170 and the plurality of wirings 802.

Hereinafter, a semiconductor device according to example embodiments of the present disclosure will be described with reference to FIG. 14. Differences from the semiconductor device shown in FIG. 5 will be mainly explained.

Figure 14:
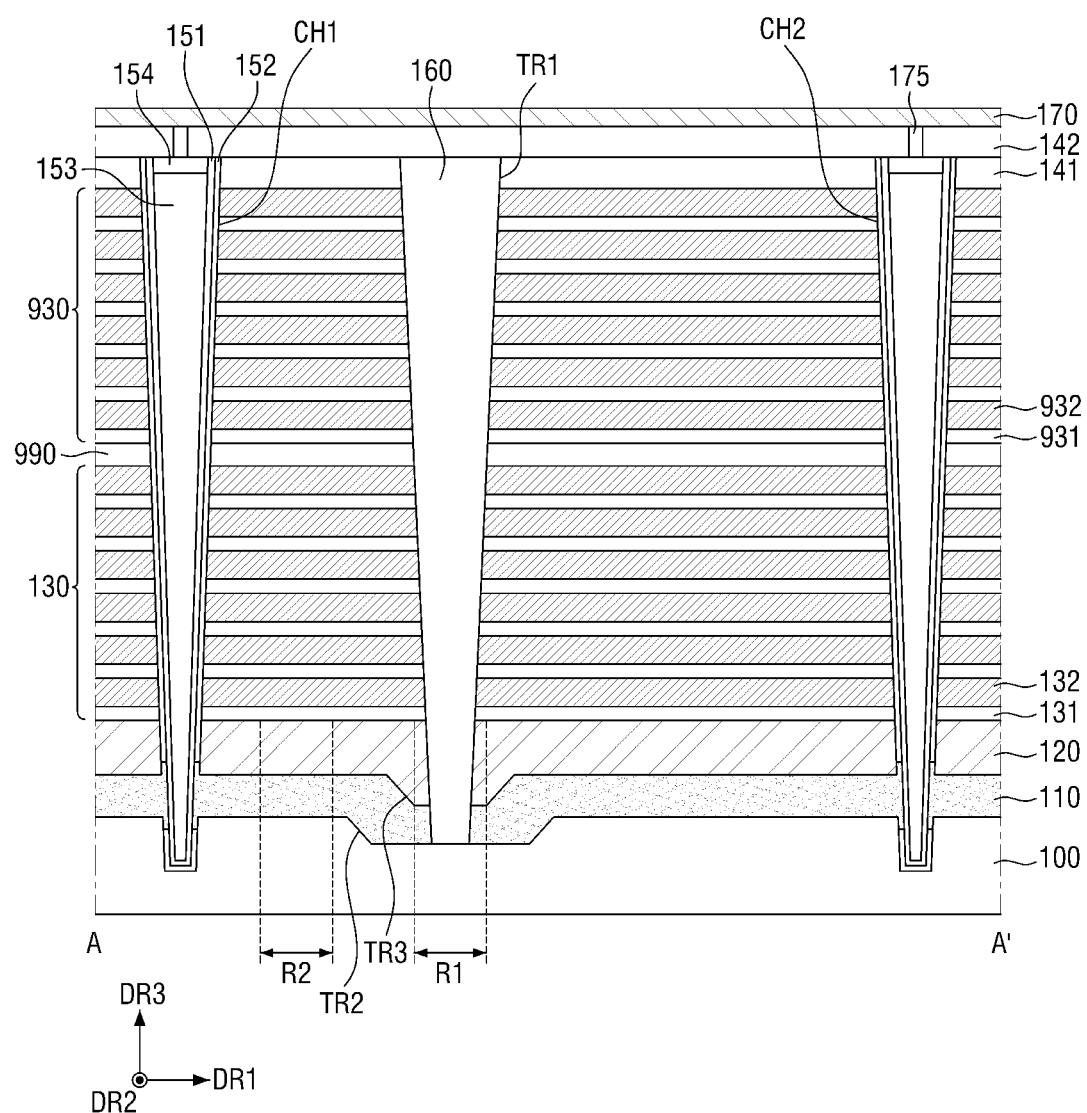
FIG. 14 is a cross-sectional view for explaining a semiconductor device, according to exemplary embodiments of the present disclosure.

FIG. 14 is a cross-sectional view for explaining the semiconductor device according to example embodiments of the present disclosure.

Referring to FIG. 14, the semiconductor device according to example embodiments of the present disclosure may include a second stack structure 930 disposed on the first stack structure 130.

A joint 990 may be disposed on the first stack structure 130. The joint 990 may include an insulating material, for example, at least one of a low dielectric constant material, an oxide film, a nitride film, and an oxynitride film. Although the joint 990 may include, for example, the same material as the first insulating film 131, the present disclosure is not limited thereto.

The second stack structure 930 may be located on the joint 990. The second stack structure 930 may include second insulating films 931 and second gate electrodes 932 alternately stacked. The second insulating film 931 may include the same material as the first insulating film 131. In addition, the second gate electrode 932 may include the same material as the first gate electrode 132.

Each of the first channel hole CH1 and the second channel hole CH2 may sequentially penetrate the second stack structure 930, the joint 990, and the first stack structure 130 in the third direction DR3. Further, the electrode isolation trench TR1 may sequentially penetrate the second stack structure 930, the joint 990, and the first stack structure 130 in the third direction DR3.

Hereinafter, a semiconductor device according to example embodiments of the present disclosure will be explained with reference to FIG. 15. Differences from the semiconductor device shown in FIG. 5 will be mainly explained.

Figure 15:
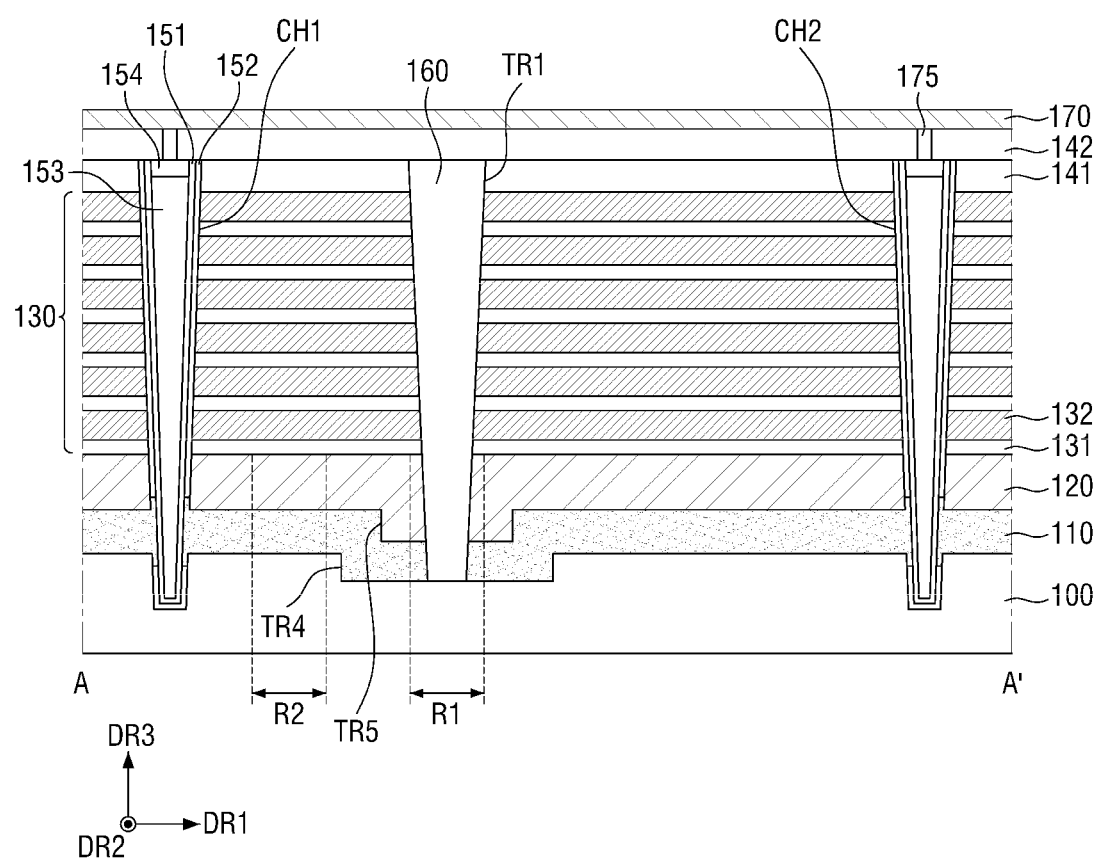
FIG. 15 is a cross-sectional view for explaining a semiconductor device, according to exemplary embodiments of the present disclosure.

FIG. 15 is a cross-sectional view for explaining the semiconductor device according to example embodiments of the present disclosure.

Referring to FIG. 15, the semiconductor device according to example embodiments of the present disclosure may be formed so that each of a sidewall of the first trench TR4 and a sidewall of the second trench TR5 extends in the third direction DR3. For example, each of the sidewall of the first trench TR4 and the sidewall of the second trench TR5 may be perpendicular to the upper surface of the first substrate 100.

Hereinafter, a method for fabricating a semiconductor device according to example embodiments of the present disclosure will be explained with reference to FIGS. 16 to 27.

FIGS. 16 to 27 are intermediate stage diagrams for explaining the method for fabricating the semiconductor device according to example embodiments of the present disclosure.

Figure 16:
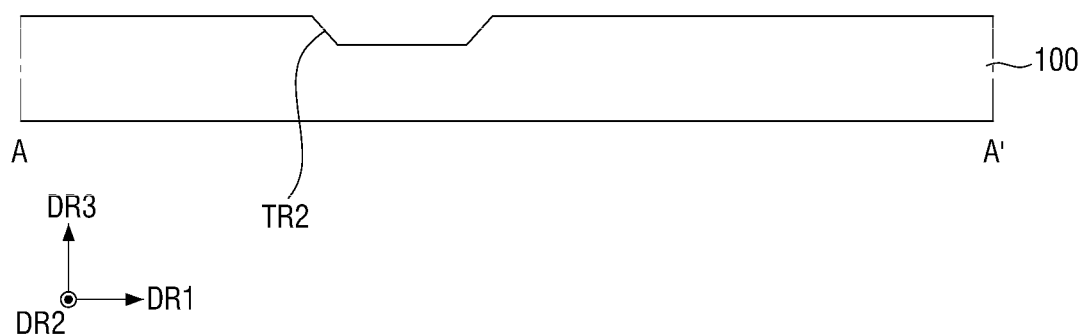
FIGS. 16 to 27 are intermediate stage diagrams for explaining a method for fabricating a semiconductor device, according to exemplary embodiments of the present disclosure.

Referring to FIG. 16, a first trench TR2 may be formed on the upper surface of the first substrate 100.

Figure 17:
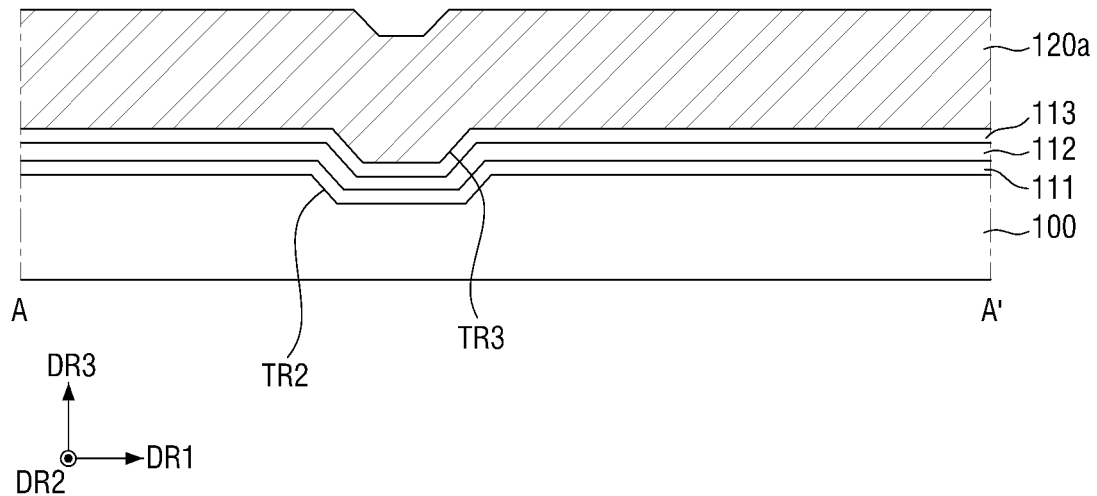

Referring to FIG. 17, a first film 111, a second film 112, a third film 113, and a first free supporter film 120a may be sequentially formed on the upper surface of the first substrate 100. Each of the first to third films 111, 112, and 113 may be conformally formed on the upper surface of the first substrate 100.

The first film 111 may include, for example, silicon oxide. The second film 112 may include, for example, silicon nitride. The third film 113 may include silicon oxide.

A second trench TR3 which overlaps the first trench TR2 in the third direction DR3 may be formed on an upper surface of the third film 113.

Figure 18:
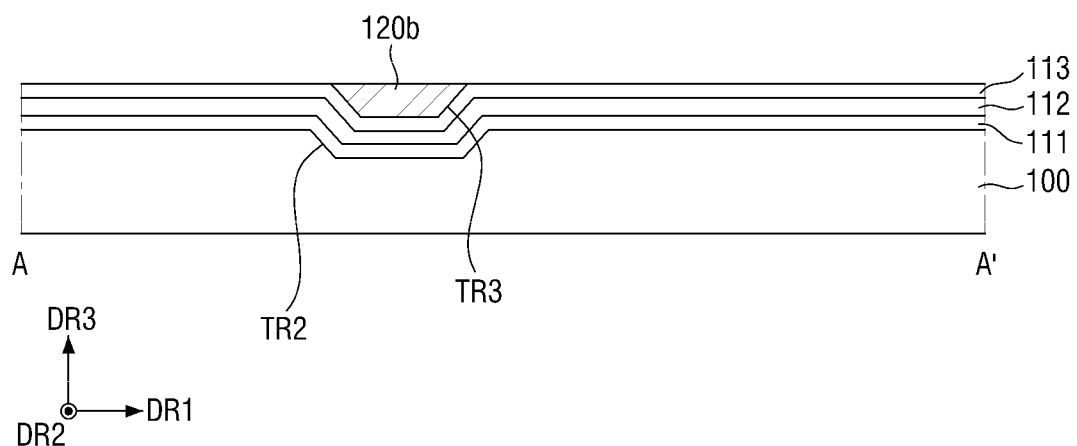

Referring to FIG. 18, the first free supporter film 120a may be etched by performing a planarization process. Therefore, the upper surface of the third film 113 may be exposed. A second free supporter film 120b may be formed inside the second trench TR3 through the planarization process.

In some other embodiments, a part of the third film 113 may be etched through the planarization process. When a part of the third film 113 is etched, the semiconductor device shown in FIG. 9 may be fabricated.

Figure 19:
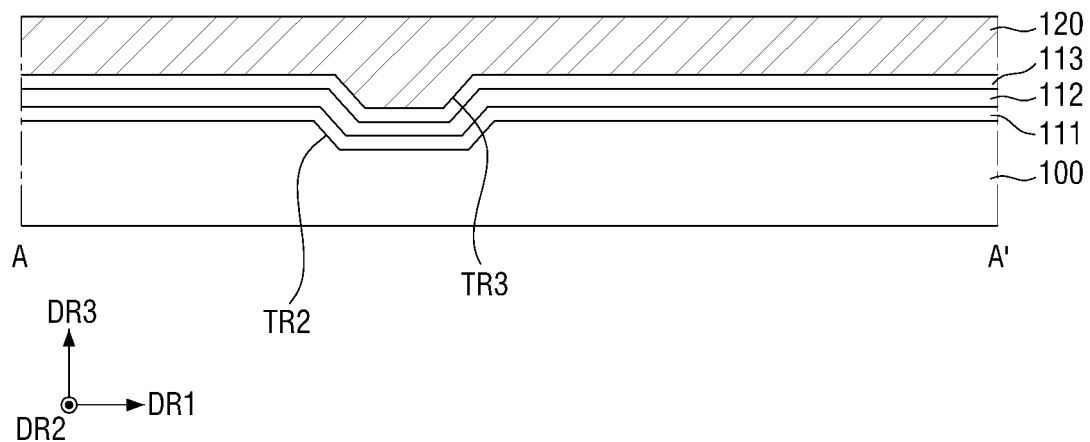

Referring to FIG. 19, a free supporter film may be further formed on the upper surface of the third film 113 and the upper surface of the second free supporter film 120b. Therefore, a supporter 120 may be formed on the third film 113. The supporter 120 may have a planar upper surface.

In some other embodiments, as shown in FIG. 17, after forming the first free supporter film 120a, only a part of the upper part of the first free supporter film 120a may be etched through the planarization process. Therefore, the supporter 120 as shown in FIG. 19 may be formed.

Figure 20:
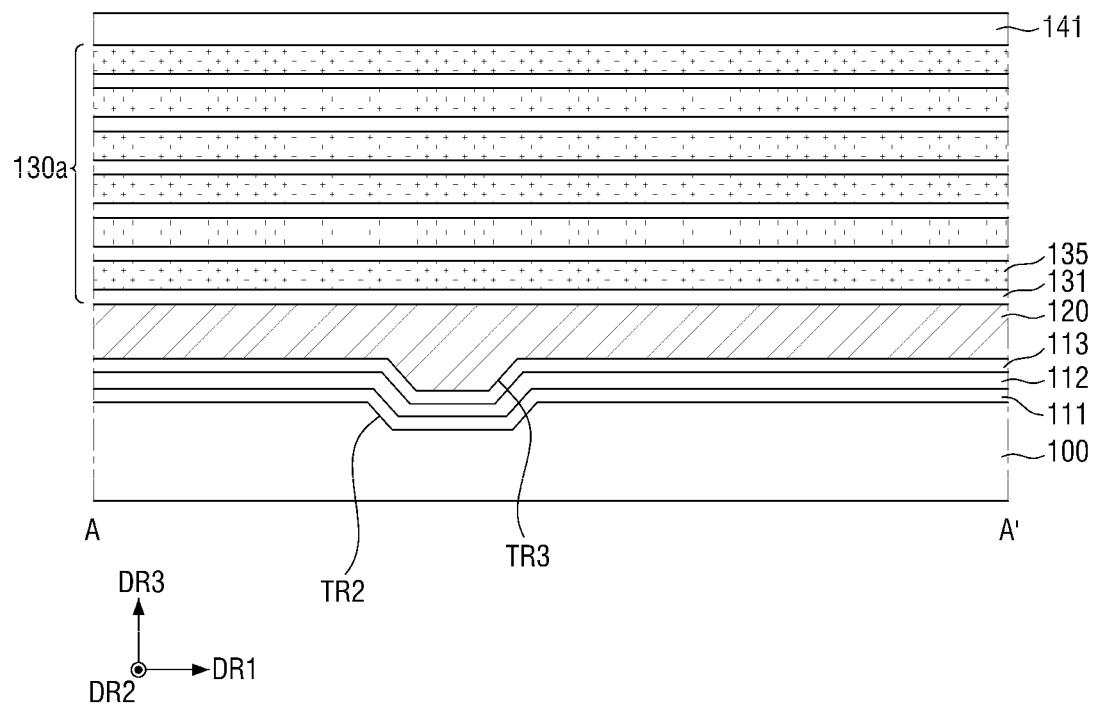

Referring to FIG. 20, a free stack structure 130a in which first insulating films 131 and sacrificial films 135 are alternately stacked may be formed on the supporter 120. The sacrificial films 135 may include, for example, silicon nitride (SiN). Subsequently, a first interlayer insulating film 141 may be formed to cover the free stack structure 130a.

Figure 21:
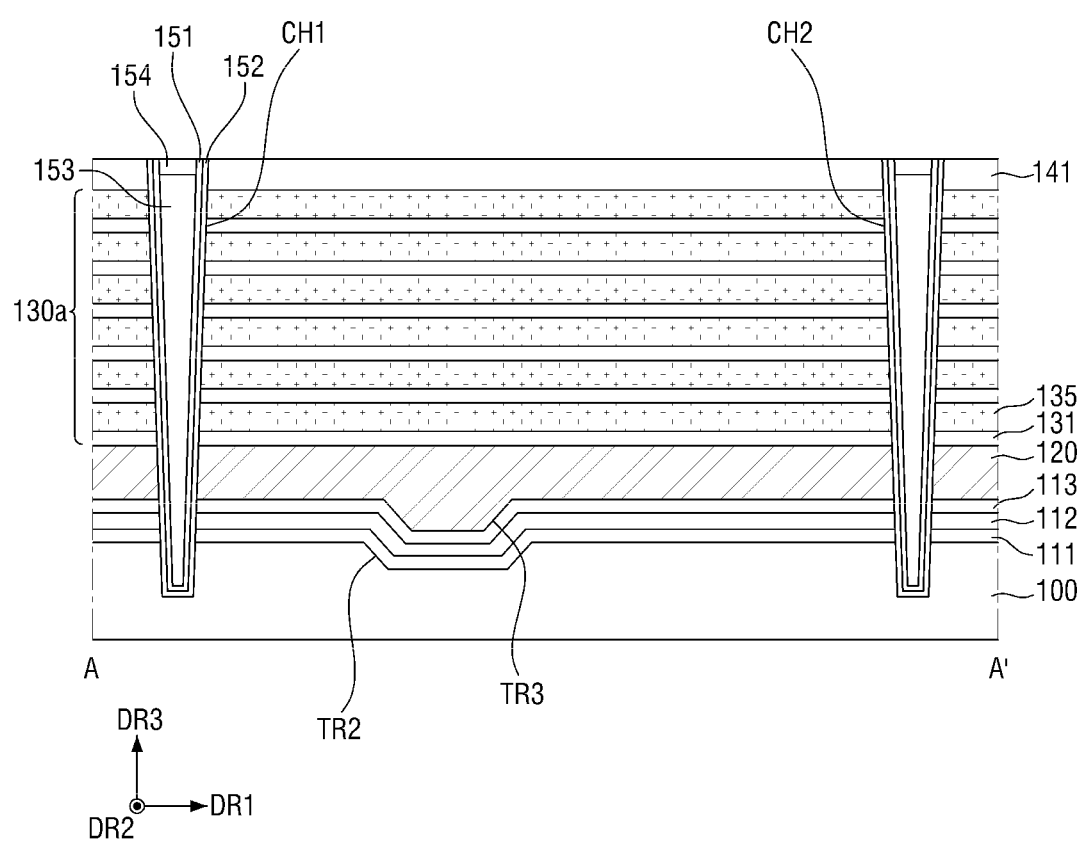

Referring to FIG. 21, a first channel hole CH1 and a second channel hole CH2 which penetrate the first interlayer insulating film 141, the free stack structure 130a, the supporter 120, and the first to third films 111, 112, and 113 in the third direction DR3 may be formed.

The first channel hole CH1 and the second channel hole CH2 may be spaced apart from each other in the first direction DR1. Each of the first channel hole CH1 and the second channel hole CH2 may extend into the first substrate 100.

Subsequently, a channel insulating film 152, a channel film 151, a channel filling film 153 and a conductive pad 154 may be provided inside the first channel hole CH1 and the second channel hole CH2, respectively.

Figure 22:
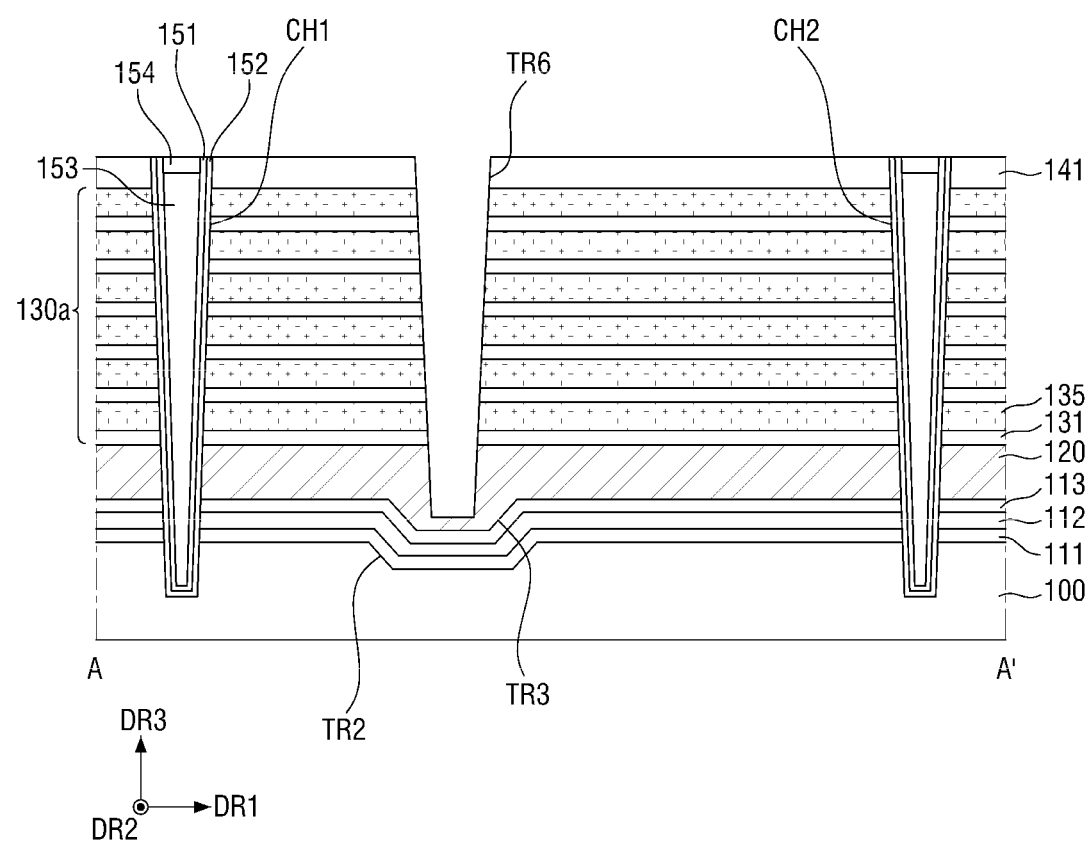

Referring to FIG. 22, a first free electrode isolation trench TR6 which penetrates the first interlayer insulating film 141 and the free stack structure 130a in the third direction DR3 may be formed between the first channel hole CH1 and the second channel hole CH2.

The first free electrode isolation trench TR6 may overlap each of the first trench TR2 and the second trench TR3 in the third direction DR3. The first free electrode isolation trench TR6 may extend inside the supporter 120. For example, a lower surface of the first free electrode isolation trench TR6 may be formed inside the supporter 120. For example, the lower surface of the first free electrode isolation trench TR6 may be formed inside the supporter 120 formed inside the second trench TR3. However, the present disclosure is not limited thereto.

Figure 23:
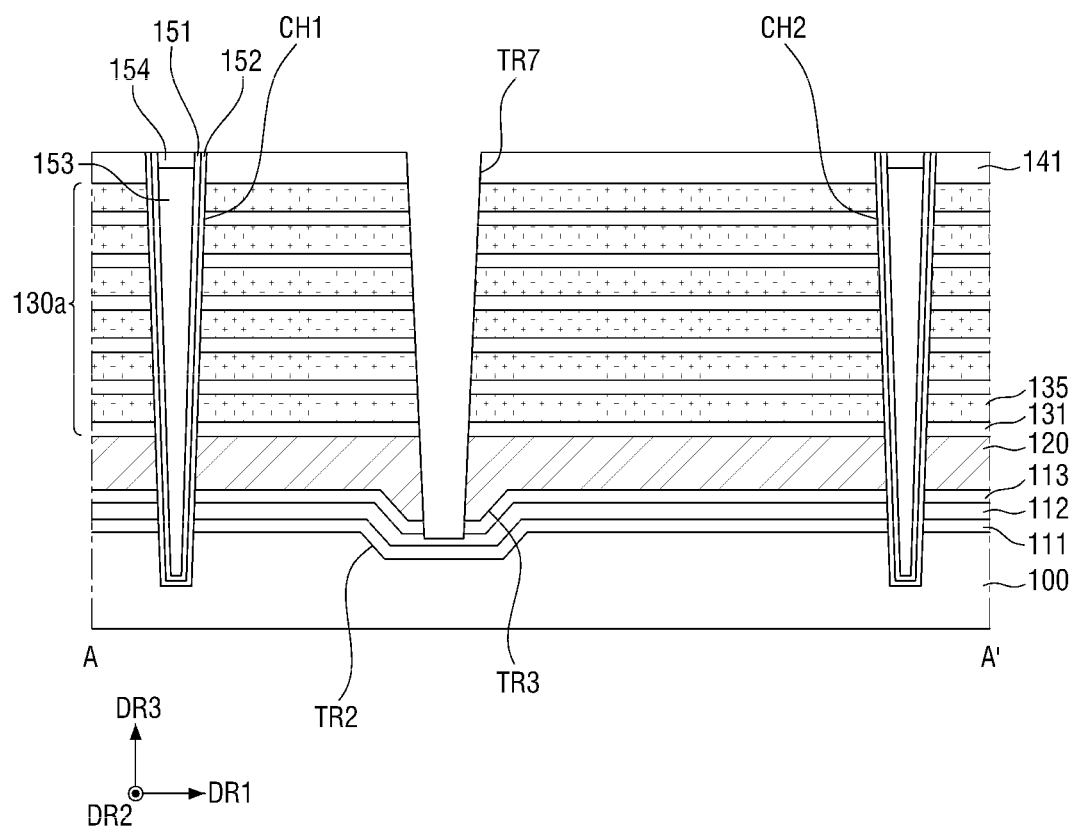

Referring to FIG. 23, an additional etching process may be performed through the first free electrode isolation trench TR6 to form a second free electrode isolation trench TR7.

The second free electrode isolation trench TR7 may penetrate the third film 113 to extend into the second film 112. For example, a lower surface of the second free electrode isolation trench TR7 may be formed inside the second film 112. However, the present disclosure is not limited thereto. For example, in some other embodiments, the lower surface of the second free electrode isolation trench TR7 may be formed inside the first film 111 or inside the third film 113.

Figure 24:
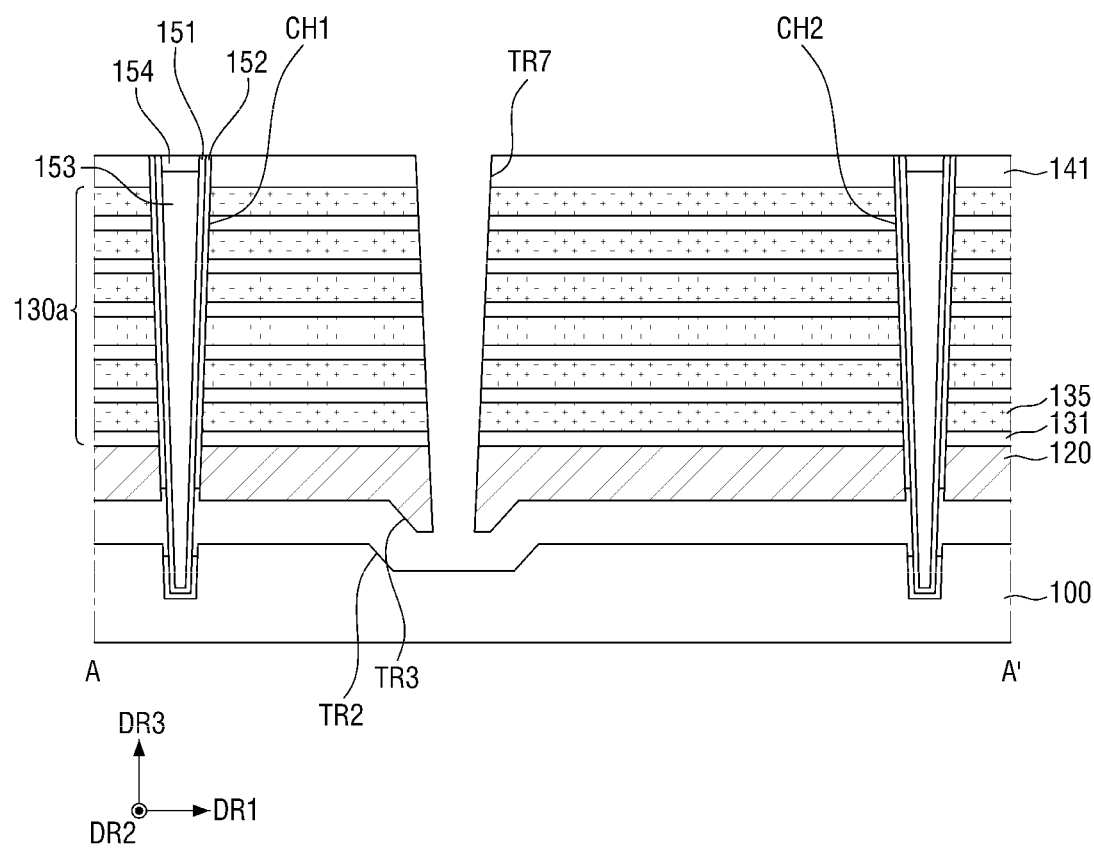

Referring to FIG. 24, the first to third films 111, 112, and 113 may be etched through the second free electrode isolation trench TR7. In this case, a part of the channel insulating film 152 formed inside each of the first channel hole CH1 and the second channel hole CH2 may be etched. Therefore, the channel film 151 may be exposed through the region in which the first to third films 111, 112, and 113 are etched.

Figure 25:
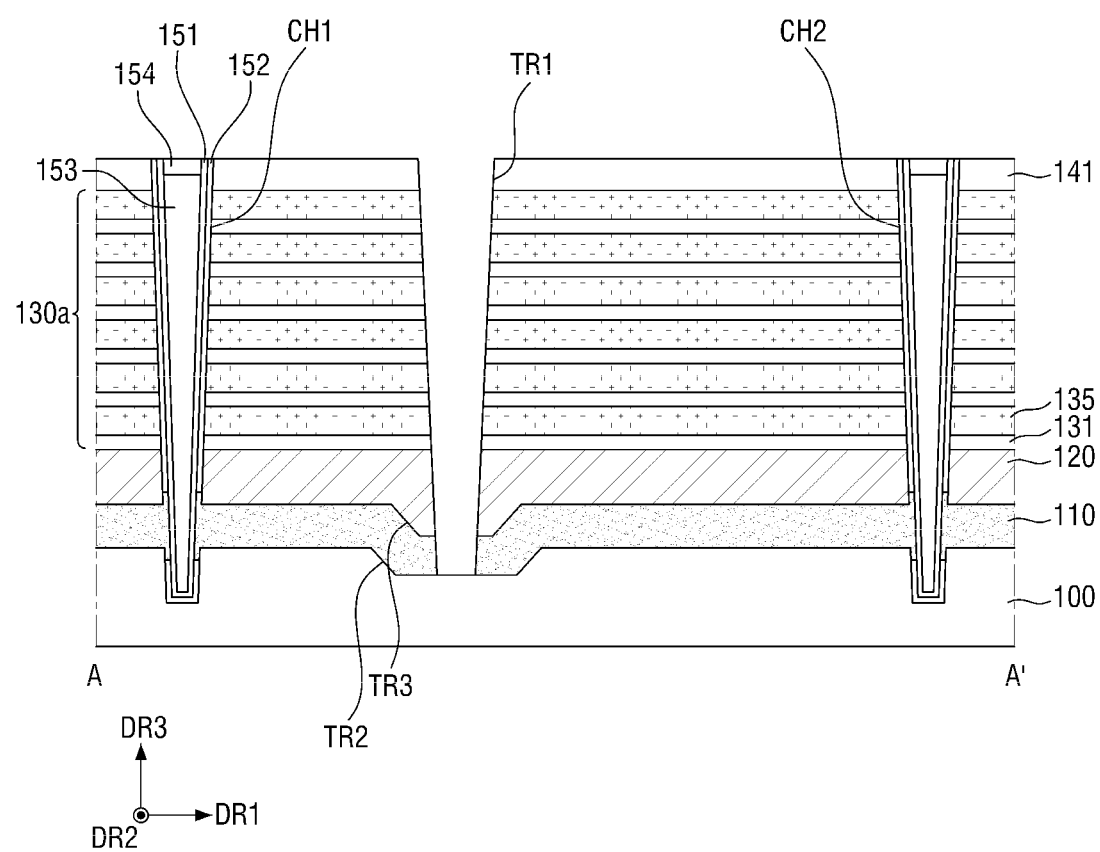

Referring to FIG. 25, a common source plate 110 may be formed in the region in which the first to third films 111, 112, and 113 are etched.

Subsequently, an additional etching process may be performed through the second free electrode isolation trench TR7 to form the electrode isolation trench TR1. The upper surface of the first substrate 100 on which the first trench TR2 is formed may be exposed through the electrode isolation trench TR1.

Figure 26:
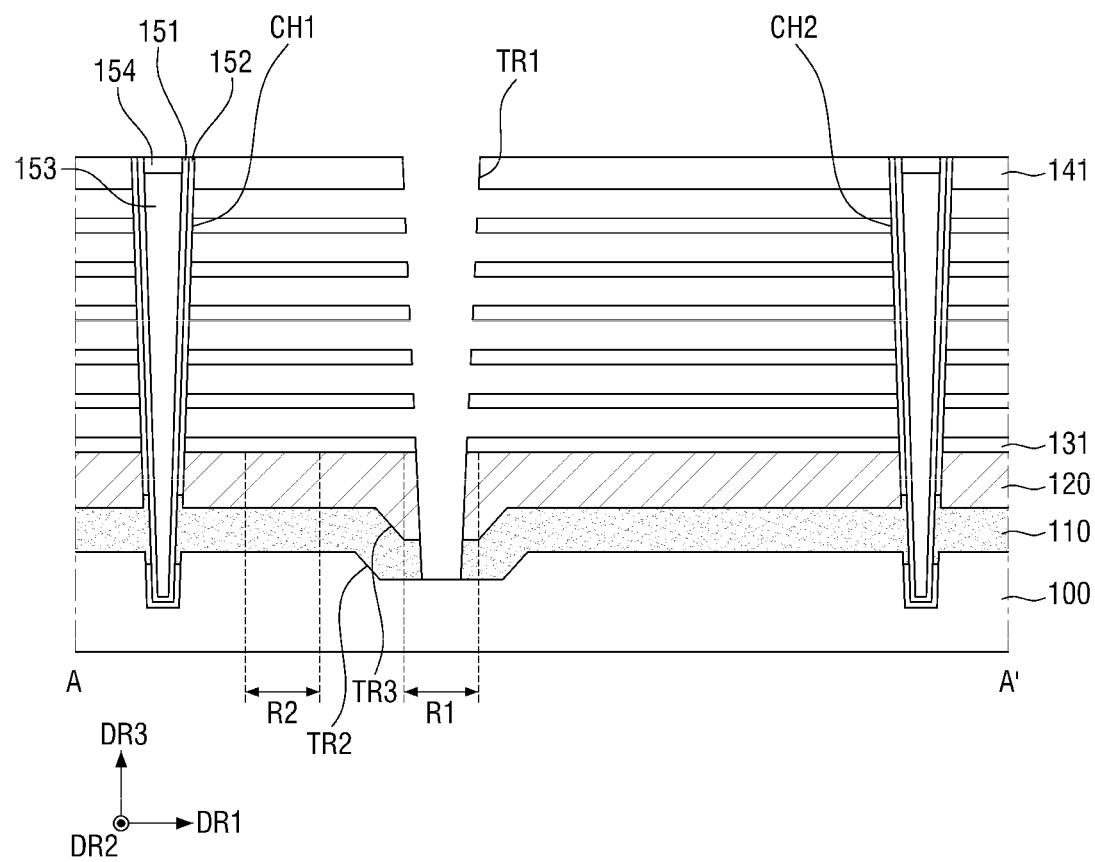

Referring to FIG. 26, the sacrificial film 135 may be removed by performing the etching process through the electrode isolation trench TR1.

Figure 27:
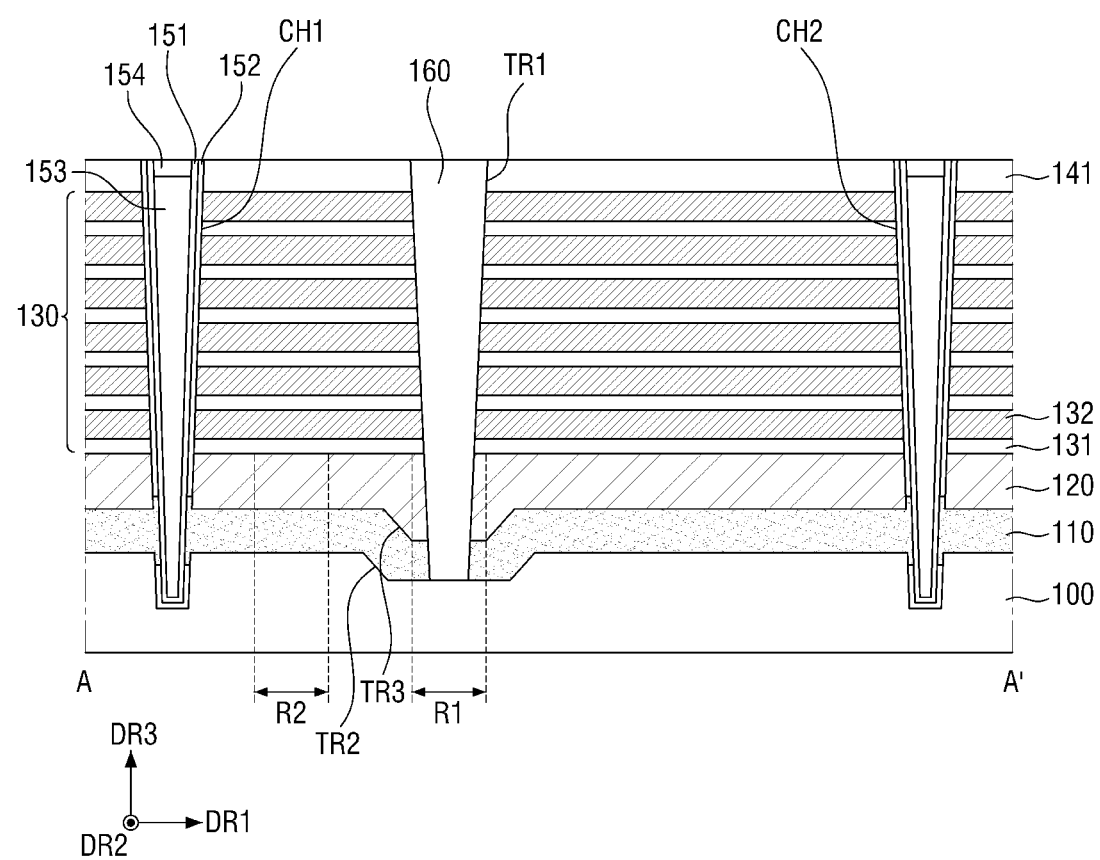

Referring to FIG. 27, the first gate electrodes 132 may be formed in regions from which the sacrificial films 135 are removed. As a result, the first stack structure 130 in which the first insulating films 131 and the first gate electrodes 132 are alternately stacked may be formed. Subsequently, an electrode isolation film 160 may be formed inside the electrode isolation trench TR1.

Subsequently, by forming the second interlayer insulating film 142, the bit line contact 175 and the bit line 170 on the first interlayer insulating film 141, the semiconductor device shown in FIG. 5 may be fabricated.

While the embodiments according to the technical concept of the present disclosure have been described above with reference to the accompanying drawings, the present disclosure is not limited to the above-described embodiments, and may be fabricated in various different forms. Those skilled in the art to which the present disclosure pertains will understand that the present disclosure may be embodied in other specific forms without changing the technical idea and essential characteristics of the present disclosure. Therefore, it should be understood that the embodiments described above are illustrative in all aspects and not restrictive.

What is claimed is:

1. A semiconductor device comprising:
   a first substrate including a cell region and an extension region surrounding the cell region;
   a common source plate disposed on the first substrate;
   a supporter disposed on the common source plate;
   a stack structure disposed on the supporter and including insulating films and gate electrodes alternately stacked;
   a channel hole penetrating the stack structure, the supporter, and the common source plate on the cell region of the first substrate;
   an electrode isolation trench spaced apart from the channel hole in a first direction on the cell region of the first substrate, extending lengthwise in a second direction perpendicular to the first direction, and penetrating the stack structure, the supporter, and the common source plate; and
   a transistor overlapping the stack structure in a third direction perpendicular to the first and second directions,
   wherein a first thickness of the supporter in a first region adjacent to the electrode isolation trench in the first direction is greater than a second thickness of the supporter in a second region formed between the electrode isolation trench and the channel hole.

2. The semiconductor device of claim 1, further comprising:
   a bit line extending lengthwise in the first direction; and
   a second substrate disposed on the bit line,
   wherein the transistor disposed between the bit line and the second substrate.

3. The semiconductor device of claim 2, further comprising:
   a conductive pad disposed inside the channel hole electrically connected to the bit line; and
   a connection line disposed between the bit line and the transistor and electrically connected to the bit line.

4. The semiconductor device of claim 1, wherein a width of the electrode isolation trench in the first direction decreases closer to the first substrate.

5. The semiconductor device of claim 1, wherein a width of the channel hole in the first direction decreases closer to the first substrate.

6. The semiconductor device of claim 1, wherein the first region includes:
   the common source plate disposed in a first trench formed in the first substrate, and
   the supporter disposed in a second trench formed in the common source plate.

7. The semiconductor device of claim 6, wherein a width of the second trench in the first direction increases as the second trench comes closer to the stack structure.

8. The semiconductor device of claim 6, wherein the second trench overlaps the first trench in the third direction.

9. The semiconductor device of claim 1, further comprising:
   a channel insulating film disposed along a sidewall and a bottom surface of the channel hole; and a channel film disposed on the channel insulating film inside the channel hole, wherein the common source plate is in contact with the channel film.

10. The semiconductor device of claim 1, wherein a third thickness of the common source plate in the first region is the same as a fourth thickness of the common source plate in the second region.

11. A semiconductor device comprising:
a first substrate having a first trench;
a common source plate disposed on the first substrate and having a second trench;
a supporter disposed on the common source plate;
a stack structure which is disposed on the supporter and including insulating films and gate electrodes alternately stacked;
first and second channel holes, each penetrating the stack structure, the supporter and the common source plate, and spaced apart from each other in a first direction;
an electrode isolation trench extending lengthwise in a second direction perpendicular to the first direction between the first channel hole and the second channel hole, and overlapping each of the first and second trenches in a third direction perpendicular to the first and second directions;
a bit line extending lengthwise in the first direction;
a second substrate disposed on the bit line; and
a transistor overlapping the stack structure in the third direction, the transistor disposed between the bit line and the second substrate,
wherein at least a part of the common source plate is disposed in the first trench, and
wherein at least a part of the supporter is disposed in the second trench.

12. The semiconductor device of claim 11, wherein a width of the electrode isolation trench in the first direction decreases closer to the first substrate.

13. The semiconductor device of claim 11, wherein a width of the first channel hole in the first direction decreases closer to the first substrate.

14. The semiconductor device of claim 11, further comprising:
a conductive pad disposed inside the channel hole electrically connected to the bit line; and
a connection line disposed between the bit line and the transistor and electrically connected to the bit line.

15. The semiconductor device of claim 11, wherein, in a first region overlapping the second trench in the third direction, the supporter has a first thickness in the third direction, and wherein, in a second region formed between the electrode isolation trench and one of the first channel hole and the second channel hole, the supporter has a second thickness in the third direction smaller than the first thickness.

16. The semiconductor device of claim 11, wherein the second trench overlaps the first trench in the third direction.

17. The semiconductor device of claim 11, further comprising:
a channel insulating film disposed along a sidewall and a bottom surface of the first channel hole; and
a channel film disposed on the channel insulating film inside the first channel hole,
wherein the common source plate is in contact with the channel film.

18. A semiconductor device comprising:
a first substrate including a cell region and an extension region surrounding the cell region;
a common source plate disposed on the first substrate;
a supporter disposed on the common source plate;
a first stack structure disposed on the supporter and including first insulating films and first gate electrodes alternately stacked;
a second stack structure disposed on the first stack structure and including second insulating films and second gate electrodes alternately stacked;
a channel hole penetrating the first stack structure, the second stack structure, the supporter, and the common source plate on the cell region of the first substrate; and
an electrode isolation trench spaced apart from the channel hole in a first direction on the cell region of the first substrate, extending lengthwise in a second direction perpendicular to the first direction, and penetrating the first stack structure, the second stack structure, the supporter, and the common source plate,
wherein a first thickness of the supporter in a first region adjacent to the electrode isolation trench in the first direction is greater than a second thickness of the supporter in a second region formed between the electrode isolation trench and the channel hole.

19. The semiconductor device of claim 18, further comprising a joint disposed between the first stack structure and the second stack structure.

20. The semiconductor device of claim 18, wherein the first region includes:
the common source plate disposed in a first trench formed in the first substrate, and
the supporter disposed in a second trench formed in the common source plate.

* * * * *